(12) United States Patent
Sugita et al.

(10) Patent No.: US 7,023,522 B2
(45) Date of Patent: Apr. 4, 2006

(54) MULTIPLE EXPOSURE METHOD

(75) Inventors: Mitsuro Sugita, Utsunomiya (JP); Miyoko Kawashima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/003,889

(22) Filed: Dec. 6, 2004

(65) Prior Publication Data

US 2005/0099614 A1    May 12, 2005

Related U.S. Application Data

(62) Division of application No. 09/337,040, filed on Jun. 28, 1999.

(30) Foreign Application Priority Data

| Jun. 30, 1998 | (JP) | 10-184235 |
| Jun. 30, 1998 | (JP) | 10-184239 |
| Jun. 30, 1998 | (JP) | 10-184240 |
| Jun. 30, 1998 | (JP) | 10-201343 |

(51) Int. Cl.
*G03B 27/42* (2006.01)
*G03B 27/52* (2006.01)

(52) U.S. Cl. .............. 355/53; 355/55; 355/67

(58) Field of Classification Search .......... 355/52, 355/53, 55, 67–71; 430/5, 22, 30, 311; 250/492.2, 250/492.22, 548; 356/399–401

See application file for complete search history.

(56) References Cited

U.S. PATENT DOCUMENTS

| 4,132,479 A | 1/1979 | Dubroeucq et al. ........... 355/71 |
| 4,908,656 A | 3/1990 | Suwa et al. .................... 355/53 |
| 5,392,094 A | 2/1995 | Kudo .......................... 355/67 |
| 5,415,835 A | 5/1995 | Brueck et al. ............. 430/311 |
| 5,467,166 A | 11/1995 | Shiraishi ..................... 355/71 |

(Continued)

FOREIGN PATENT DOCUMENTS

EP    0 698 824 A2    2/1996

(Continued)

OTHER PUBLICATIONS

European Search Report dated Aug. 23, 2002, issued in corresponding European patent appln. No. 99305098.8-1242, forwarded in a communication dated Sep. 9, 2002.

(Continued)

*Primary Examiner*—Henry Hung Nguyen
(74) *Attorney, Agent, or Firm*—Fitzpatrick, Cella, Harper & Scinto

(57) ABSTRACT

An exposure apparatus including a first exposure device for illuminating a predetermined mask with light of a predetermined wavelength under a first mask-illumination condition, to print a first pattern on a predetermined exposure region, and a second exposure device for illuminating the predetermined mask with light of the predetermined wavelength under a second mask-illumination condition, different from the first mask-illumination condition, to superposedly print a second pattern on the predetermined exposure region where the first pattern has been printed. A first exposure by the first exposure device and a second exposure by the second exposure device are carried out simultaneously, prior to a development process.

61 Claims, 26 Drawing Sheets

U.S. PATENT DOCUMENTS

| | | | | |
|---|---|---|---|---|
| 5,617,181 A | * | 4/1997 | Yanagihara et al. | 355/46 |
| 5,642,183 A | | 6/1997 | Sugihara et al. | 355/71 |
| 5,677,757 A | | 10/1997 | Taniguchi et al. | 355/71 |
| 5,680,588 A | | 10/1997 | Gortych et al. | 395/500 |
| 5,688,409 A | | 11/1997 | Dao et al. | 216/48 |
| 5,863,712 A | * | 1/1999 | Von Bunau et al. | 430/396 |
| 6,218,089 B1 | | 4/2001 | Pierrat | 430/394 |
| 6,259,513 B1 | | 7/2001 | Gallatin et al. | 355/71 |
| 6,403,285 B1 | | 6/2002 | Holscher et al. | 430/311 |

FOREIGN PATENT DOCUMENTS

| | | |
|---|---|---|
| EP | 0 811 881 A2 | 12/1997 |
| JP | 6-333802 | 12/1994 |
| JP | 7-226362 | 8/1995 |
| JP | 7-253649 | 10/1995 |
| JP | 9-055350 | 2/1997 |
| JP | 9-199390 | 7/1997 |
| JP | 10-233361 | 9/1998 |
| WO | WO 97/11411 | 3/1997 |

OTHER PUBLICATIONS

European Search Report dated Feb. 8, 2002, issued in corresponding European patent appln. No. 99305098.8-1242, forwarded in a communication dated Apr. 5, 2002.

Partial translation of Japanese Office Action mailed Aug. 17, 2004, issued by the Japanese Patent Office in corresponding Japanese patent appln. No. 10-184240.

Partial translation of Japanese Office Action mailed Aug. 17, 2004, issued by the Japanese Patent Office in corresponding Japanese patent appln. No. 10-184239.

Partial translation of Japanese Office Action mailed Aug. 17, 2004, issued by the Japanese Patent Office in corresponding Japanese patent appln. No. 10-184235.

Communication pursuant to Article 96(2) EPC dated Jun. 9, 2005, issued in corresponding European patent application No. 99 305 098.8.

* cited by examiner

SEPARATION BOUNDARY OF GATES (~1CD)

INTEGRATED GATE CHART defocus = 0   defocus = ± 0.2   defocus = ± 0.4

FINE PATTERN
EXPOSURE

COARSE PATTERN
EXPOSURE

DUAL EXPOSURE

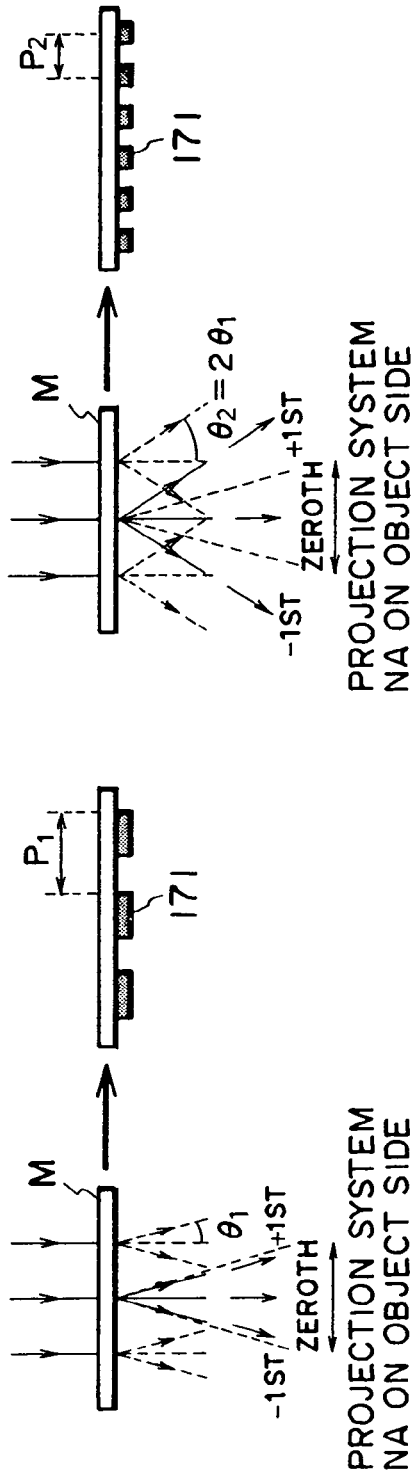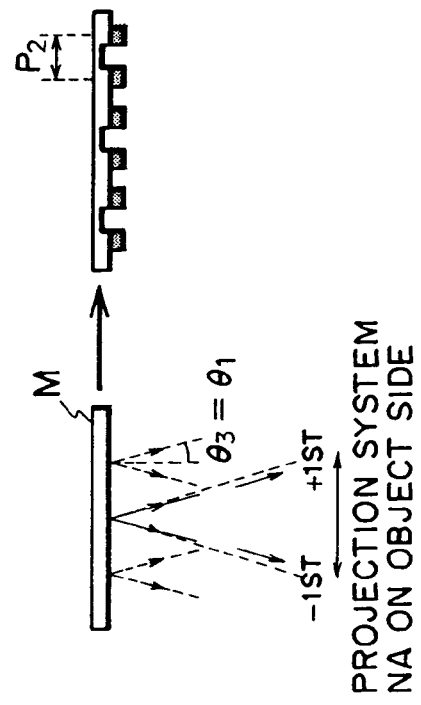
FIG. 27A
FIG. 27B
FIG. 27C

MULTIPLE EXPOSURE METHOD

This application is a divisional of copending patent application Ser. No. 09/337,040, filed Jun. 28, 1999.

FIELD OF THE INVENTION AND RELATED ART

This invention relates to an exposure method and an exposure apparatus and, more particularly, to an exposure method and an exposure apparatus for lithographically printing a fine circuit pattern on a photosensitive substrate. The exposure method or exposure apparatus of the present invention is usable for the manufacture of various devices such as semiconductor chips (ICs or LSIs), display devices (liquid crystal panels), detecting devices (magnetic heads), or image pickup devices (CCDs), for example.

Generally, the manufacture of devices such as ICs, LSIs or liquid crystal panels based on lithography uses a projection exposure method and a projection exposure apparatus by which a circuit pattern of a photomask or reticle (hereinafter, "mask") is projected through a projection optical system onto a photosensitive substrate such as a silicon wafer or glass plate (hereinafter, "wafer") having a photoresist coating applied thereto, whereby the pattern is printed on the substrate.

Enlargement in the density of such a device has forced a reduction in the linewidth of a pattern to be printed on a wafer as well as an increase in area of a chip to be produced on the wafer. In the field of projection exposure methods and projection exposure apparatuses, most important in wafer micro-processing technology, improvements in resolution and exposure area have been attempted so as to enable formation of an image of a size (linewidth) of 0.5 micron or less in a wider area.

FIG. 15 is a schematic view of a projection exposure apparatus of a known type. In FIG. 15, denoted at 191 is an excimer laser, which is a light source for exposure with deep ultraviolet light. Denoted at 192 is an illumination optical system, and denoted at 193 is illumination light. Denoted at 194 is a mask, and denoted at 195 is object side exposure light coming from the mask 194 and impinging on a reduction projection optical system 196. Denoted at 197 is image side exposure light coming from the optical system 196 and impinging on a substrate 198, which is a wafer (photosensitive substrate). Denoted at 199 is a substrate stage for holding the photosensitive substrate.

Laser light emitted from the excimer laser 191 is directed by a guiding optical system to the illumination optical system 192, by which it is adjusted and transformed into illumination light 193 having a predetermined intensity distribution, a predetermined directional characteristic distribution, and a predetermined opening angle (numerical aperture: NA), for example. The light then illuminates the mask 194.

The mask 194 has a pattern of chromium, for example, formed on a quartz substrate with a size corresponding to an inverse (e.g., 2×, 4× or 5×) of the projection magnification of the projection optical system 192. The illumination light 193 is transmissively diffracted by this fine pattern of the mask 194, whereby object side exposure light 195 is produced.

The projection optical system 196 functions to convert the object side exposure light 195 into image side exposure light 197, which images the fine pattern of the mask 194 upon the wafer 198 at the projection magnification and with sufficiently small aberration. As illustrated in an enlarged view at the bottom of FIG. 15, the image side exposure light 197 is converged on the wafer 198 with a predetermined numerical aperture NA (=sin θ), whereby an image of the fine pattern is formed on the wafer 198.

The substrate stage 199 moves stepwise the wafer 198 along the image plane of the projection optical system to successively change the position of the wafer 198 with respect to the projection optical system 196, when fine patterns are to be successively formed on different regions (shot regions each corresponding to one or plural chips) on the wafer.

With current projection exposure apparatuses having an excimer laser as a light source, however, it is very difficult to form a pattern of 0.15 micron or less.

The projection optical system such as at 196 has a limitation in resolution due to a trade-off between the depth of focus and the optical resolution attributable to the exposure wavelength (wavelength to be used in exposure). The depth of focus DOF and the resolution F of a resolvable pattern in projection exposure apparatuses can be expressed in accordance with Rayleigh's equations such as equations (1) and (2) below.

$$R = k_1(\lambda/NS) \tag{1}$$

$$DOF = k_2(\lambda/NA)^2 \tag{2}$$

where λ is the exposure wavelength, NA is the numerical aperture on an image side which represents the brightness of the projection optical system 196, and $k_1$ and $k_2$ are constants determined in accordance with characteristics of a development process of the wafer 198, for example. Usually, they have a value of about 0.5–0.7.

It is seen from equations (1) and (2) that, while higher resolution (making resolution R smaller) is attainable with enlargement of the numerical aperture ("NA enlargement"), since, in a practical exposure process, the depth of focus DOF of the projection optical system 196 should be kept at a certain value or more, the NA enlargement beyond a certain extent is not possible, and that improvement of resolution anyway needs a reduction of exposure wavelength λ ("wavelength shortening").

However, the wavelength shortening involves a critical problem. That is, there is no glass material for lenses of the projection optical system 196. Most glass materials have a transmission factor which is close to zero in the deep ultraviolet regions. While there is fused silica (quartz) as a glass material manufactured by special processes for use in an exposure apparatus (exposure wavelength of about 248 nm), even the transmission factor of fused silica largely decreases for an exposure wavelength of 193 nm or less. In the region of an exposure wavelength of 150 nm or shorter, which corresponds to a fine pattern of 0.15 micron or less, development of a practical glass material is very difficult. Further, for glass materials to be used in the deep ultraviolet region, in addition to the transmission factor, many other conditions such as durability, uniformess of refractive index, optical distortion or easiness of machining, for example, must be satisfied. In these respects, too, development of practical glass materials is difficult to accomplish.

In conventional projection exposure methods and projection exposure apparatuses, as described above, although shortening of the exposure wavelength to about 150 nm is necessary to produce a pattern of 0.15 micron or less on a wafer, because there is no practical glass material in such a wavelength region, it is practically difficult to produce a pattern of 0.15 micron or less on the wafer.

U.S. Pat. No. 5,415,835 shows a procedure of forming a fine pattern with a dual-beam interference exposure process. With this dual beam interference exposure process, a pattern of 0.15 micron or less can be produced on a wafer.

In accordance with the dual-beam interference exposure process, laser light from a laser having coherency and comprising a parallel light ray flux is divided by a half mirror into two light beams which are then reflected by flat mirrors, respectively, so that these laser beams (coherent parallel light fluxes) intersect with each other at a certain angle larger than 0 degrees and smaller than 90 degrees, by which an interference fringe is produced at the intersection. A resist of a wafer is exposed and sensitized with this interference fringe (light intensity distribution thereof), by which a fine periodic pattern (exposure amount distribution) corresponding to the light intensity distribution of the interference fringe is produced on the wafer (resist thereof).

When two light beams being inclined with respect to a normal to a wafer surface in opposite directions and with the same angle intersect with each other upon the wafer surface, a resolution R attainable with the dual-beam interference exposure can be expressed by equation (3) below.

$$R = \lambda/(4\sin\theta)$$
$$= \lambda/4NA$$
$$= 0.25(\lambda/NA)$$
(3)

where R corresponds to widths of a line-and-space pattern (lines and spaces), that is, the widths of bright and dark portions of the interference fringe, $\theta$ is the incidence angle (absolute value) of the two light beams upon the image plane, and NA=sin $\theta$.

Comparing equation (1) related to the resolution in ordinary projection exposure and equation (3) related to resolution in dual-beam interference exposure, it is seen that, since the resolution R in dual-beam interference exposure corresponds to a case where $k_1$=0.25 is put in equation (1), a resolution twice or more higher than the resolution with ordinary projection exposure, where $k_1$=0.5 to 0.7, is attainable with the dual-beam interference exposure. Although it is not specifically mentioned in the aforementioned U.S. Pat. No. 5,415,835, a resolution R=0.10 micron may be attainable, for example, with $\lambda$=0.248 nm (KrF excimer laser) and NA=0.6.

With the dual-beam interference exposure, however, basically, only a simple fringe pattern corresponding to the light intensity distribution (exposure amount distribution) of an interference fringe can be produced. It is not possible to form a circuit pattern of a desired shape upon a wafer.

In consideration of this, in the aforementioned U.S. Pat. No. 5,415,835, after a simple fringe pattern, i.e., a binary exposure amount distribution, is applied to a wafer (resist thereof) through the dual-beam interference exposure process, an ordinary or standard lithography (exposure) process is performed by using a mask with an opening to that and an additional binary exposure amount distribution is applied to the wafer, by which isolated lines (patterns) are produced. This is called a "multiple exposure method".

In accordance with the multiple exposure method disclosed in the aforementioned U.S. Pat. No. 5,415,835, however, after a wafer is loaded into an exposure apparatus for a dual-beam exposure process and the exposure process is performed, the wafer has to be loaded again into a separate exposure apparatus for an ordinary exposure process. This takes a significant amount of time.

SUMMARY OF THE INVENTION

It is an object of the present invention to provide an exposure method and/or an exposure apparatus by which a multiple exposure process can be performed in a relatively short time.

In a first form of an exposure method according to the present invention, one and the same mask pattern is projected onto a common exposure region in accordance with bright-field illumination, with a constant exposure wavelength, while changing an illumination condition.

In a second form of an exposure method according to the present invention, one and the same mask pattern is projected onto a common exposure region in accordance with bright-field illumination under a small $\sigma$ and a large $\sigma$.

In a third form of an exposure method according to the present invention, one and the same mask pattern is projected onto a common exposure region in accordance with bright-field illumination, with a small numerical aperture NA and a large numerical aperture NA.

In a fourth form of an exposure method according to the present invention, one and the same mask pattern is projected onto a common exposure region in accordance with bright-field oblique illumination and bright-field perpendicular illumination.

Here, the oblique illumination is a form of illumination wherein illumination is made along a direction inclined with respect to an optical axis of a projection optical system. The perpendicular illumination is a form of illumination wherein illumination is made along a direction parallel to the optical axis of the projection optical system.

In a first form of an exposure apparatus according to the present invention, there is an exposure mode in which one and the same mask pattern is projected onto a common exposure region in accordance with bright-field illumination, with a constant exposure wavelength, while changing an illumination condition.

In a second form of an exposure apparatus according to the present invention, there is an exposure mode in which one and the same mask pattern is projected onto a common exposure region in accordance with bright-field illumination under a small $\sigma$ and a large $\sigma$. Here, sigma ($\sigma$) corresponds to a value obtainable by dividing a mask side numerical aperture of an illumination optical system by a mask side numerical aperture of a projection optical system.

In a third form of an exposure apparatus according to the present invention, there is an exposure mode in which one and the same mask pattern is projected onto a common exposure region in accordance with bright-field illumination, with a small numerical aperture NA and a large numerical aperture NA. Here, the numerical aperture NA corresponds to a mask side numerical aperture of an illumination optical system.

In a fourth form of an exposure apparatus according to the present invention, there is an exposure mode in which one and the same mask pattern is projected onto a common exposure region in accordance with bright-field oblique illumination and bright-field perpendicular illumination.

In accordance with the first to fourth forms of exposure methods and first to fourth forms of exposure apparatuses of the present invention as described above, a multiple exposure process can be performed by placing a certain mask in a certain exposure apparatus (e.g., a reduction projection exposure apparatus of a step-and-repeat type or a step-andscan type) and by setting different illumination conditions in that exposure apparatus for that mask pattern (one and the same mask pattern). Therefore, as compared with a conventional procedure in which two different exposure apparatuses are used, the time necessary for the multiple exposure process can be shortened significantly.

The words "small σ" or "large σ" refer only to the relative magnitude of σ. That is, it means a σ which is smaller (or larger) than a certain σ. Similarly, the words "small NA" or "large NA" refer only to the relative magnitude of the numerical aperture. That is, it means a numerical aperture NA which is smaller (or larger), than a certain numerical aperture NA.

In one preferred embodiment in these forms of the present invention, the mask pattern is illuminated light from one of a KrF excimer laser (wavelength of about 248 nm), an ArF excimer laser (wavelength of about 193 nm) and an $F_2$ excimer laser (wavelength of about 157 nm).

The mask pattern may be projected by use of a projection optical system comprising one of a dioptric system, a catadioptric system and a catoptric system.

The exposures of the exposure region under different illumination conditions may be performed sequentially without a development process to the exposure region.

The exposures of the exposure region under different illumination conditions are performed simultaneously without mutual interference of lights in the different illumination conditions. For example, the lights may comprise linearly polarized lights whose polarization directions are set orthogonal to each other.

The mask pattern may include an opening pattern with a linewidth (e.g., about 0.1 micron) not greater than a resolution limit of an exposure apparatus to be used.

There may be plural opening patterns juxtaposed with each other, to define repetition patterns.

The mask pattern may include a phase shift pattern of a Levenson type or a rim type.

There may be an auxiliary pattern disposed adjacent to the opening pattern.

In accordance with another aspect of the present invention, there is provided a device manufacturing method, comprising the steps of: exposing a wafer to a device pattern by use of any one of the first to fourth forms of exposure methods or the first to fourth forms of exposure apparatuses, and developing the exposed wafer.

In a fifth form of an exposure method according to the present invention, one and the same mask pattern is projected onto a common exposure region through illumination while changing an illumination condition and a spatial frequency passage spectrum of a projection optical system. Here, the spatial frequency passage spectrum refers to a light passage condition of a pupil of the projection optical system.

In a sixth form of an exposure method according to the present invention, one and the same mask pattern is projected onto a common exposure region through illumination under a small σ and a large σ, while changing a spatial frequency passage spectrum of a projection optical system. Here, sigma (σ) corresponds to a value obtainable by dividing a mask side numerical aperture of an illumination optical system by a mask side numerical aperture of a projection optical system. The spatial frequency passage spectrum refers to a light passage condition of a pupil of the projection optical system.

In a seventh form of an exposure method according to the present invention, one and the same mask pattern is projected onto a common exposure region through illumination with a small numerical aperture NA and a large numerical aperture NA, while changing a spatial frequency passage spectrum of a projection optical system. Here, the numerical aperture NA corresponds to a mask side numerical aperture of an illumination optical system. The spatial frequency passage spectrum refers to a light passage condition of a pupil of the projection optical system.

In an eighth form of an exposure method according to the present invention, one and the same mask pattern is projected onto a common exposure region through oblique illumination and perpendicular illumination, while changing a spatial frequency passage spectrum of a projection optical system. Here, the oblique illumination is a form of illumination wherein illumination is made along a direction inclined with respect to an optical axis of a projection optical system. The perpendicular illumination is a form of illumination wherein illumination is made along a direction parallel to the optical axis of the projection optical system. The spatial frequency passage spectrum refers to a light passage condition of a pupil of the projection optical system.

In a fifth form of an exposure apparatus according to the present invention, there is an exposure mode in which one and the same mask pattern is projected onto a common exposure region through illumination while changing an illumination condition and a spatial frequency passage spectrum of a projection optical system. Here, the spatial frequency passage spectrum refers to a light passage condition of a pupil of the projection optical system.

In a sixth form of an exposure apparatus according to the present invention, there is an exposure mode in which one and the same mask pattern is projected onto a common exposure region through illumination under small σ and large σ, while changing a spatial frequency passage spectnrum of a projection optical system. Here, sigma (σ) corresponds to a value obtainable by dividing a mask side numerical aperture of an illumination optical system by a mask side numerical aperture of a projection optical system. The spatial frequency passage spectrum refers to a light passage condition of a pupil of the projection optical system.

In a seventh form of an exposure apparatus according to the present invention, there is an exposure mode in which one and the same mask pattern is projected onto a common exposure region through illumination with a small numerical aperture NA and a large numerical aperture NA, while changing a spatial frequency passage spectrum of a projection optical system. Here, the numerical aperture NA corresponds to a mask side numerical aperture of an illumination optical system. The spatial frequency passage spectrum refers to a light passage condition of a pupil of the projection optical system.

In an eighth form of an exposure apparatus according to the present invention, there is an exposure mode in which one and the same mask pattern is projected onto a common exposure region through oblique illumination and perpendicular illumination, while changing a spatial frequency passage spectrum of a projection optical system. Here, the spatial frequency passage spectrum refers to a light passage condition of a pupil of the projection optical system.

In accordance with the fifth to eighth forms of exposure methods and fifth to eighth forms of exposure apparatuses of the present invention as described above, a multiple exposure process can be performed by placing a certain mask in a certain exposure apparatus (e.g., a reduction projection exposure apparatus of a step-and-repeat type or a step-and-scan type) and by setting different illumination conditions in that exposure apparatus for that mask pattern (one and the same mask pattern). Therefore, as compared with a conventional procedure in which two different exposure apparatuses are used, the time necessary for the multiple exposure process can be shortened significantly.

The words "small σ" or "large σ" refer only to the relative magnitude of σ. That is, it means a σ which is smaller (or larger) than a certain σ. Similarly, the words "small NA" or "large NA" refer only to the relative magnitude of numerical aperture. That is, it means a numerical aperture NA which is smaller (or larger) than a certain numerical aperture.

In one preferred embodiment in these forms of the present invention, the mask pattern is illuminated with light from one of a KrF excimer laser (wavelength of about 248 nm), an ArF excimer laser (wavelength of about 193 runm) and an $F_2$ excimer laser (wavelength of about 157 nm).

The mask pattern may be projected by use of a projection optical system comprising one of a dioptric system, a catadioptric system and a catoptric system.

The exposures of the exposure region under different illumination conditions may be performed sequentially without a development process to the exposure region.

The exposures of the exposure region under different illumination conditions are performed simultaneously without mutual interference of lights in the different illumination conditions. For example, the lights may comprise linearly polarized lights whose polarization directions are set to be orthogonal to each other.

The mask pattern may include an opening pattern with a linewidth (e.g., about 0.1 micron) not greater than a resolution limit of an exposure apparatus to be used.

There may be plural opening patterns juxtaposed with each other, to define repetition patterns.

The mask pattern may include a phase shift pattern or a Levenson type or a rim type.

The spatial frequency passage spectrum may be changed by changing the aperture shape of an aperture stop of the projection optical system or the transmission factor distribution thereof.

In accordance with another aspect of the present invention, there is provided a device manufacturing method, comprising the steps of: exposing a wafer to a device pattern by use of any one of the fifth to eighth forms of exposure methods or the fifth to eighth forms of exposure apparatuses, and developing the exposed wafer.

In a ninth form of an exposure method according to the present invention, one and the same mask pattern, having a predetermined pattern with an auxiliary pattern annexed thereto, is projected onto a common exposure region through illumination, while changing an illumination condition.

In a tenth form of an exposure method according to the present invention, one and the same mask pattern, having a predetermined pattern with an auxiliary pattern annexed thereto, is projected onto a common exposure region through illumination under a small σ and a large σ. Here, sigma (σ) corresponds to a value obtainable by dividing a mask side numerical aperture of an illumination optical system by a mask side numerical aperture of a projection optical system.

In an eleventh form of an exposure method according to the present invention, one and the same mask pattern, having a predetermined pattern with an auxiliary pattern annexed thereto, is projected onto a common exposure region through illumination, with a small numerical aperture NA and a large numerical aperture NA. Here, the numerical aperture NA corresponds to a mask side numerical aperture of an illumination optical system.

In a twelfth form of an exposure method according to the present invention, one and the same mask pattern, having a predetermined pattern with an auxiliary pattern annexed thereto, is projected onto a common exposure region through oblique illumination and perpendicular illumination. Here, the oblique illumination is a form of illumination where illumination is made along a direction inclined with respect to an optical axis of a projection optical system. The perpendicular illumination is a form of illumination wherein illumination is made along a direction parallel to the optical axis of the projection optical system.

In a ninth form of an exposure apparatus according to the present invention, there is an exposure mode in which one and the same mask pattern, having a predetermined pattern with an auxiliary pattern annexed thereto, is projected onto a common exposure region through illumination, while changing an illumination condition.

In a tenth form of an exposure apparatus according to the present invention, there is an exposure mode in which one and the same mask pattern, having a predetermined pattern with an auxiliary pattern annexed thereto, is projected onto a common exposure region through illumination under small σ and large σ. Here, sigma (σ) corresponds to a value obtainable by dividing a mask side numerical aperture of an illumination optical system by a mask side numerical aperture of a projection optical system.

In an eleventh form of an exposure apparatus according to the present invention, there is an exposure mode in which one and the same mask pattern, having a predetermined pattern with an auxiliary pattern annexed thereto, is projected onto a common exposure region through illumination, with a small numerical aperture NA and a large numerical aperture NA. Here, the numerical aperture NA corresponds to a mask side numerical aperture of an illumination optical system.

In a twelfth form of an exposure apparatus according to the present invention, there is an exposure mode in which one and the same mask pattern, having a predetermined pattern with an auxiliary pattern annexed thereto, is projected onto a common exposure region through oblique illumination and perpendicular illumination.

In accordance with the ninth to twelfth forms of exposure methods and ninth to twelfth forms of exposure apparatuses of the present invention as described above, a multiple exposure process can be performed by placing a certain mask in a certain exposure apparatus (e.g., a reduction projection exposure apparatus of a step-and-repeat type or a step-and-scan type) and by setting different illumination conditions in that exposure apparatus for that mask pattern (one and the same mask pattern). Therefore, as compared with a conventional procedure in which two different exposure apparatuses are used, the time necessary for the multiple exposure process can be shortened significantly.

The words "small σ" or "large σ" refer only to the relative magnitude of σ. That is, it means a σ which is small (or larger) than a certain σ. Similarly, the words "small NA" or "large NA" refer only to the relative magnitude of numerical aperture. That is, it means a numerical aperture NA which is smaller (or larger) than a certain numerical aperture NA.

In one preferred embodiment in these forms of the present invention, the mask pattern is illuminated light from one of a KrF excimer laser (wavelength of about 248 nm), an ArF excimer laser (wavelength of about 193 nm) and an $F_2$ excimer laser (wavelength of about 157 nm).

The mask pattern may be projected by use of a projection optical system comprising one of a dioptric system, a catadioptric system and a catoptric system.

The exposures of the exposure region under different illumination conditions may be performed sequentially without a development process to the exposure region.

The exposures of the exposure region under different illumination conditions are performed simultaneously without mutual interference of lights in the different illumination conditions. For example, the lights may comprise linearly polarized lights whose polarization directions are set orthogonal to each other.

The mask pattern may include an opening pattern with a linewidth (e.g., about 0.1 micron) not greater than a resolution limit of an exposure apparatus to be used.

There may be plural opening patterns juxtaposed with each other, to define repetition patterns.

The mask pattern may include a phase shift pattern or a Levenson type or a rim type.

There may be an auxiliary pattern disposed adjacent to the opening pattern.

In accordance with another aspect of the present invention, there is provided a device manufacturing method, comprising the steps of: exposing a wafer to a device pattern by use of any one of the ninth to twelfth forms of exposure methods or the ninth to twelfth forms of exposure apparatuses, and developing the exposed wafer.

In a thirteenth form of an exposure method according to the present invention, an illumination region of a predetermined shape is illuminated through an illumination optical system and with exposure light from light source means, wherein a pattern of a mask provided at the illumination region is projected by a projection optical system onto a photosensitive substrate, characterized in that the mask has a repetition pattern comprising repeatedly disposed plural basic patterns constituted by light transmissive portions, that adjacent light transmissive portions of the repetition pattern have a mutual optical phase difference of about 180 degrees, and that the photosensitive substrate is exposed to the mask pattern through multiple exposures while changing an illumination condition of the illumination optical system and a light passage condition of a pupil plane of the projection optical system.

Here, the illumination condition to be changed may be the magnitude of sigma ($\sigma$) or the magnitude of numerical aperture NA. The light passage condition to be changed may be a spatial frequency passage spectrum of the pupil of the projection optical system.

In a thirteenth form of an exposure apparatus according to the present invention, there is an exposure mode in which a pattern of a mask is transferred onto a photosensitive substrate in accordance with the thirteenth form of the exposure method as described above.

The words "multiple exposure" refer in this specification to a process in which one and the same region on a photosensitive substrate is exposed with mutually different light patterns without intervention of a development process.

In accordance with the thirteenth form of an exposure method and the thirteenth form of an exposure apparatus of the present invention, as described above, a multiple exposure process can be performed by placing a certain mask in a certain exposure apparatus (e.g., a reduction projection exposure apparatus of a step-and-repeat type or a step-and-scan type) and by setting different illumination conditions in that exposure apparatus for that mask pattern (one and the same mask pattern). Therefore, as compared with a conventional procedure in which two different exposure apparatuses are used, the time necessary for the multiple exposure process can be shortened significantly.

The words "small $\sigma$" or "large $\sigma$" refer only to the relative magnitude of $\sigma$. That is, it means a $\sigma$ which is smaller (or larger) than a certain $\sigma$. Similarly, the words "small NA" or "large NA" refer only to the relative magnitude of the numerical aperture. That is, it means a numerical aperture NA which is smaller (or larger) than a certain numerical aperture NA.

In one preferred embodiment in these forms of the present invention, the mask pattern is illuminated light from one of a KrF excimer laser (wavelength of about 248 nm), an ArF excimer laser (wavelength of about 193 nm) and an $F_2$ excimer laser (wavelength of about 157 nm).

The mask pattern may be projected by use of a projection optical system comprising one of a dioptric system, a catadioptric system and a catoptric system.

The exposures of the exposure region under different illumination conditions may be performed sequentially without a development process to the exposure region.

The exposures of the exposure region under different illumination conditions are performed simultaneously without mutual interference of lights in the different illumination conditions. For example, the lights may comprise linearly polarized lights whose polarization directions are set to be orthogonal to each other.

The mask pattern may include an opening pattern with a linewidth (e.g., about 0.1 micron) not greater than a resolution limit of an exposure apparatus to be used.

There may be plural opening patterns juxtaposed with each other, to define repetition patterns.

The mask pattern may include a phase shift pattern or a Levenson type or a rim type.

The spatial frequency passage spectrum may be changed by changing the aperture shape of an aperture stop of the projection optical system or the transmission factor distribution thereof.

In accordance with another aspect of the present invention, there is provided a device manufacturing method, comprising the steps of: exposing a wafer to a device pattern by use of the thirteenth form of the exposure method or the thirteenth form of exposure apparatus, and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 27A–27C are schematic views, respectively, for explaining the effect of a Levenson type mask.

DESCRIPTION OF THE PREFERRED EMBODIMENTS

Figure 1:
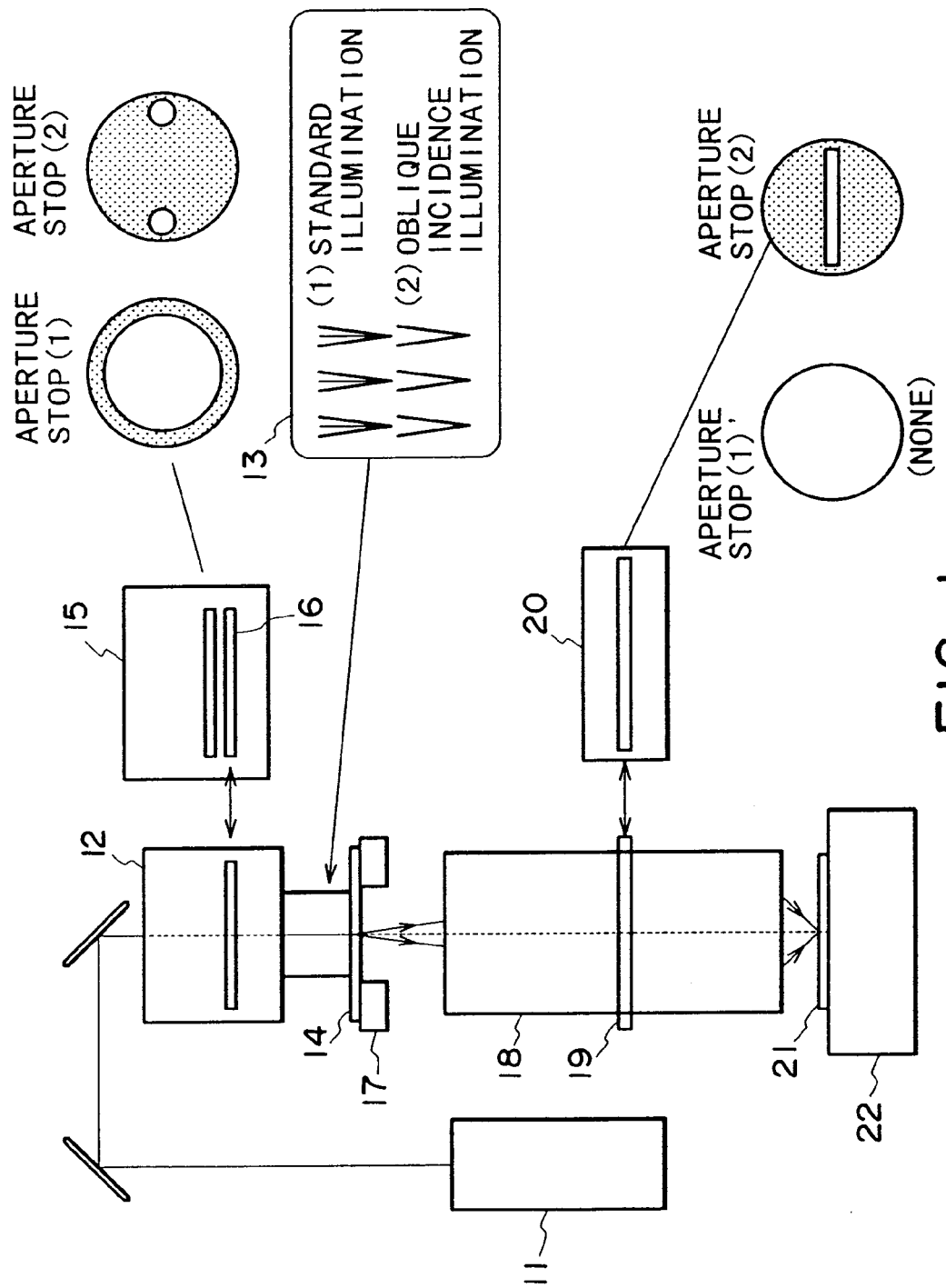
FIG. 1 is a schematic view for explaining an example of an exposure apparatus according to the present invention.

A first embodiment of the present invention will be described below.

The first embodiment has a feature that, in a projection exposure apparatus, the illumination condition of an illumination optical system and an aperture stop of a projection optical system are changed in operation association with each other.

In accordance with this embodiment, a projection exposure apparatus is equipped with an illumination condition changing mechanism and an aperture stop changing mechanism, which may be similar to those used conventionally. Therefore, the present embodiment does not need a large modification of the structure. Further, the multiple exposure process of this embodiment needs, basically, only a single mask which can be produced by patterning similar to conventional masks, with only a small modification. The manufacturing cost is, therefore, not large.

This embodiment does not use an exclusive dual-beam interferometer. Also, there is no necessity of using, in a projection exposure apparatus, a special mask such as a Levenson type phase shift mask exclusive for dual-beam interference. Only by appropriately setting the illumination condition of an illumination optical system as well as the shape of an aperture stop of a projection optical system in relation to an ordinary mask having a circuit pattern to be transferred to a wafer, apparent "dual-beam interference (formation of fine interference fringe)" can be accomplished.

The principle of multiple exposure in this embodiment is as follows. Control of a spatial frequency spectrum of a mask pattern through an illumination condition and control of a spatial frequency spectrum of the mask pattern through an aperture stop of a projection optical system are combined so as to extract, from the mask, a spatial frequency component with which dual-beam interference can be substantively produced, such that a very fine linear pattern (a pattern of a repetition of such linear patterns) included in the mask, which cannot be resolved by ordinary exposure, can be printed on a resist of a wafer independently, by exposure based on dual-beam interference best suited for that pattern, whereby a periodic latent image can be formed thereon. On the other hand, by using the same mask pattern, a latent image is formed superposedly on the wafer resist through an ordinary exposure process (the order of latent image formation may be reversed). On the basis of the thus accumulated latent images (accumulated exposure amount distributions), a development process is performed, whereby a desired circuit pattern is produced.

With this multiple exposure process, various fine patterns included in a single mask can be transferred with the limit performance of a projection optical system, such that the performance of the projection exposure apparatus having been restricted in a simple single-exposure can be best utilized.

For example, with a projection exposure apparatus having a KrF excimer laser (wavelength of about 248 nm) and a projection lens system with an image side numerical aperture (NA) of 0.6, even a pattern (image) of a linewidth of 0.1 micron can be printed (formed as latent image) on a resist of a silicon wafer. This linewidth is a half of the minimum printing linewidth of about 0.2 micron, which is the limit linewidth of current projection exposure apparatuses. Thus, the resolution attainable is about double.

Figure 2:
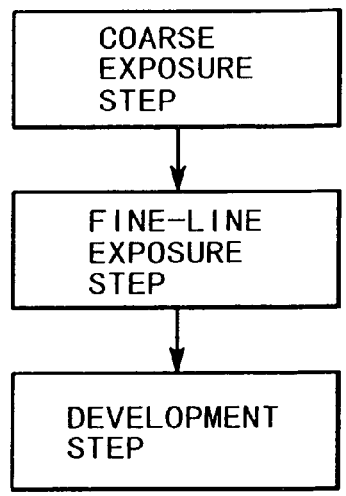
FIG. 2 is a flow chart for explaining an example of an exposure method according to the present invention.

FIG. 2 shows a basic flow chart according to the multiple exposure process of this embodiment.

As shown in FIG. 2, the multiple exposure process of this embodiment includes a coarse exposure step and a fine exposure step. The coarse and fine exposure steps may be performed in reverse order. If one or both of these exposure steps comprises plural exposures (shots), the coarse and fine exposure steps may be repeated alternately. No development process is performed between the coarse and fine exposures.

A wafer alignment step of a known process may be interposed between these exposure steps, if necessary. This may be effective to improve the image formation precision. Thus, in this embodiment, the sequence and procedure are not limited to those shown in FIG. 2.

Figure 3:
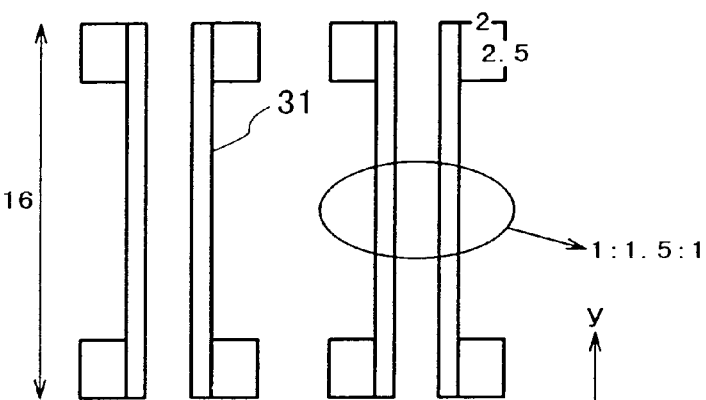
FIG. 3 is a schematic view for explaining a gate charge shape.
Figure 3:
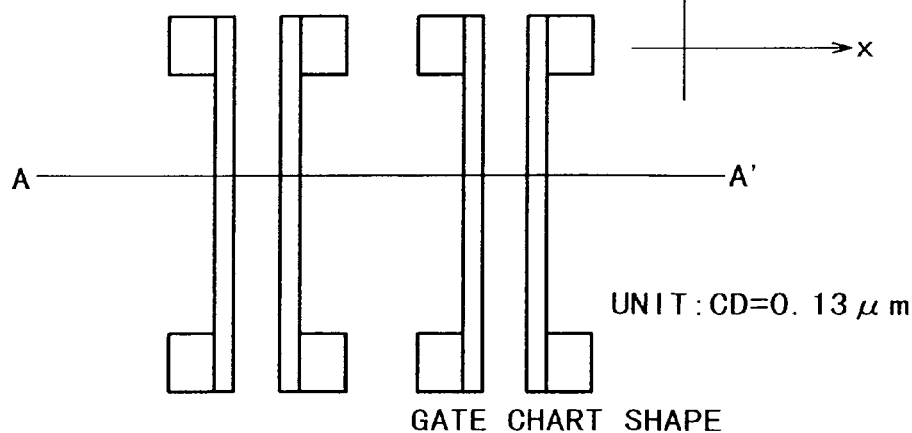

When a multiple exposure process is to be performed in accordance with the procedure shown in FIG. 2, first, a coarse exposure is performed by using a certain mask with a pattern (mask pattern) and a projection exposure apparatus, by which a photosensitive substrate such as a wafer is exposed with an image of the mask pattern. That is, a corresponding latent image is formed on the resist. Since what is intended in this embodiment is to print, on a photosensitive substrate, an image of an extraordinarily fine linewidth, narrower than the minimum linewidth which can be resolved by a projection optical system, the mask pattern includes a pattern corresponding to the linewidth narrower than the minimum linewidth above. FIG. 3 shows an example of such a mask pattern.

The pattern shown in FIG. 3 is one called a gate pattern to be used in an ASIC of a semiconductor device. Denoted in FIG. 3 at 31 is a gate line, which is a main portion for playing the function of switching. Minimization of the linewidth of this gate line has been desired. On the other hand, denoted at 32 is a wiring contact portion. Since this portion 32 needs an area of a certain extent, it is larger in size than the gate line 31. Thus, this gate pattern includes a mixture of a fine linear pattern corresponding to an image smaller than the minimum linewidth which can be resolved by the projection optical system, and a pattern larger than it. The larger pattern can be resolved by the coarse exposure (projection exposure), but the fine line pattern is not resolved. The depth of focus in this case is shallow.

Subsequently, to the same region (common region) of the photosensitive substrate to which the coarse exposure has been performed, a fine exposure is performed without a development process, such that the resist on the same region is exposed with an image of the fine linear pattern. The multiple exposure process is completed with this. In accordance with the fine exposure process of this embodiment, in relation to one and the same mask pattern and without changing it, the exposure is performed after changing the illumination condition of the illumination optical system, for illuminating the mask, and also the shape of the aperture stop of the projection optical system for projecting the mask pattern (as compared with those for the coarse exposure).

Figure 4:
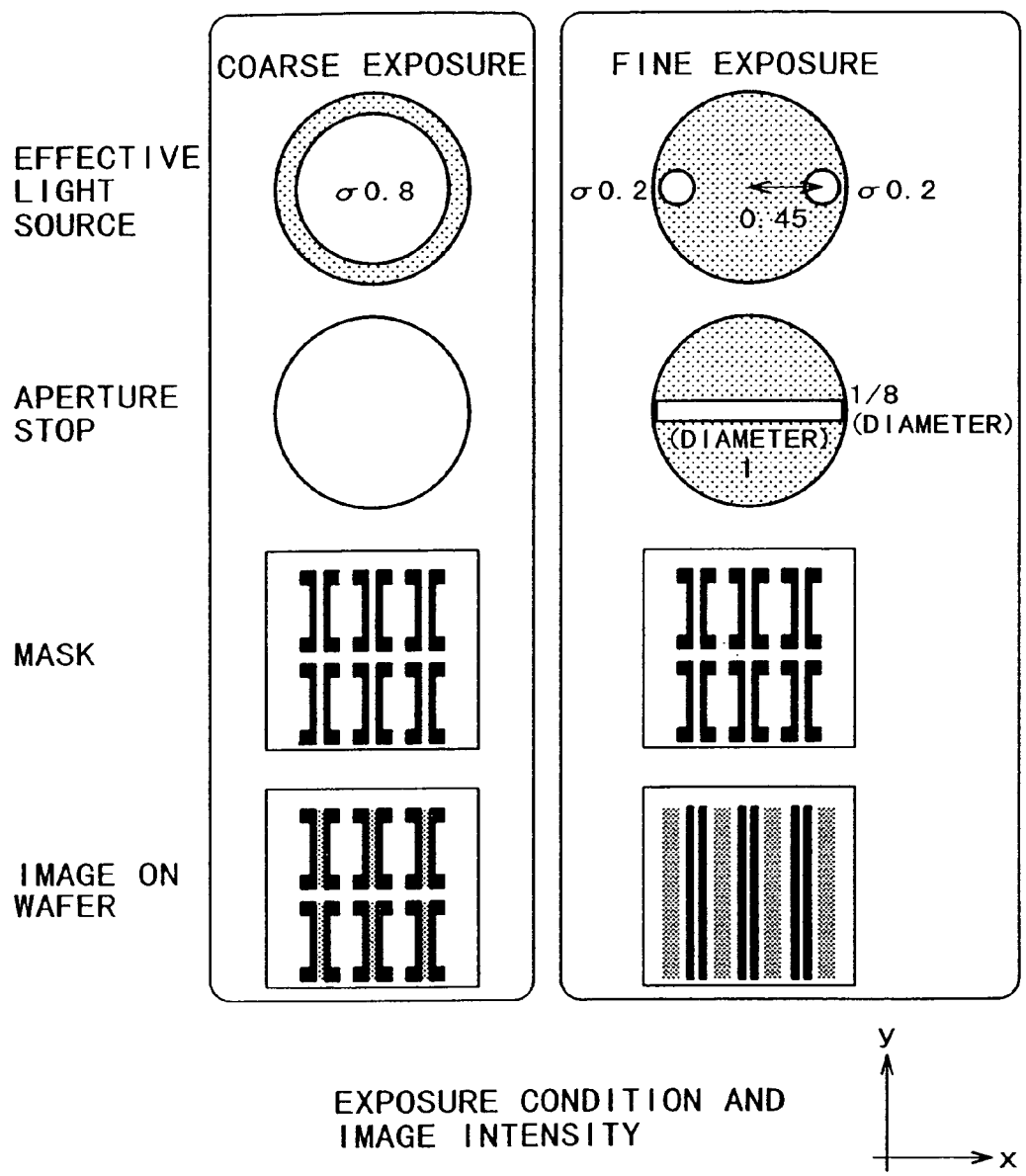
FIG. 4 is a schematic view for explaining an exposure condition and image intensity, in a first embodiment of an exposure method according to the present invention.

FIG. 4 illustrates the shapes of effective light sources to be defined for the coarse and fine exposures in this embodiment (i.e., the shapes of images as the aperture stop of the illumination optical system is projected on the aperture of the aperture stop of the projection optical system), as well as the aperture shape of the aperture stop of the projection optical system and a mask and an image on a wafer.

As shown in FIG. 4, in this embodiment, in relation to one and the same mask pattern, the coarse exposure process uses a perpendicular illumination method (ordinary or standard illumination method) with an effective light source of $\sigma$=about 0.8 being formed, while a stop member having an ordinary circular opening is used as the aperture stop of the projection optical system. On the other hand, the fine exposure process uses an oblique illumination method with a dual-pole effective light source being formed (a pair of circular light sources of $\sigma$=about 0.2 are defined symmetrically with respect to the optical axis and they are arrayed along the X direction in which fine line patterns of a gate pattern array (mask pattern) are repeated), while a stop member having an oblong aperture being elongated in the X direction (the direction in which fine line patterns of the gate pattern array (mask pattern) are repeated) is used as the aperture stop of the projection optical system. A multiple exposure process is performed on the basis of these coarse and fine exposures. In FIG. 4, the directions of the X and Y axes are in alignment with the X and Y axes of the gate pattern of FIG. 3.

Figure 5:
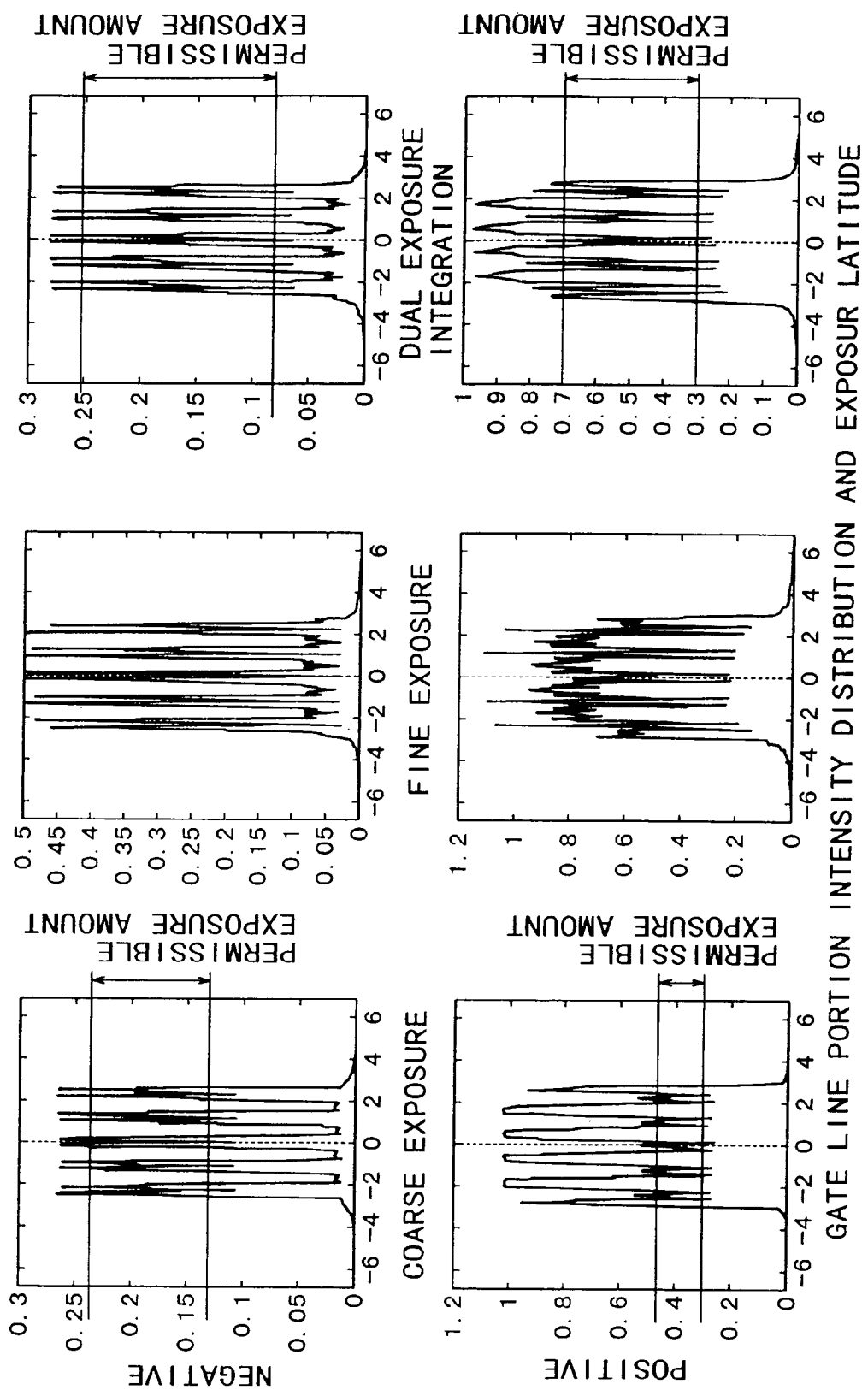
FIG. 5 is a schematic view for explaining an intensity distribution and an exposure latitude at a fine-line portion, in the first embodiment of the present invention.

FIG. 5 shows examples of a light intensity distribution (in section) of pattern images in the multiple exposure process described above. Specifically, FIG. 5 illustrates the light intensity distribution along A–A' section at the middle of the gate line of the gate pattern shown in FIG. 3. In FIG. 5, the upper portion shows the results of exposures when a negative type resist is used, and the lower portion shows the results of exposures when a positive type resist is used. In the upper and lower portions, those illustrated from left to right are the result of coarse exposure, the result of fine exposure and the integrated result of dual exposure (coarse and fine exposures).

It is seen in FIG. 5 that the range of the permissible exposure amount (exposure latitude) with which a gate line can be printed is narrow only with a single exposure of coarse exposure; whereas, in accordance with the dual exposure (multiple exposure) process, a light intensity distribution of a gate line pattern having a large contrast is integrated through the fine exposure such that the range of permissible exposure amount is extended to be about double in the case of exposure of a negative type resist or to about triple in the case of exposure of a positive type resist.

Namely, with the multiple exposure procedure of this embodiment, a resist of a substrate can be exposed and sensitized (a latent image is formed) stably with an image of a pattern of higher resolution (narrower linewidth), beyond an ordinary resolution limit of an exposure apparatus.

Figure 14A:
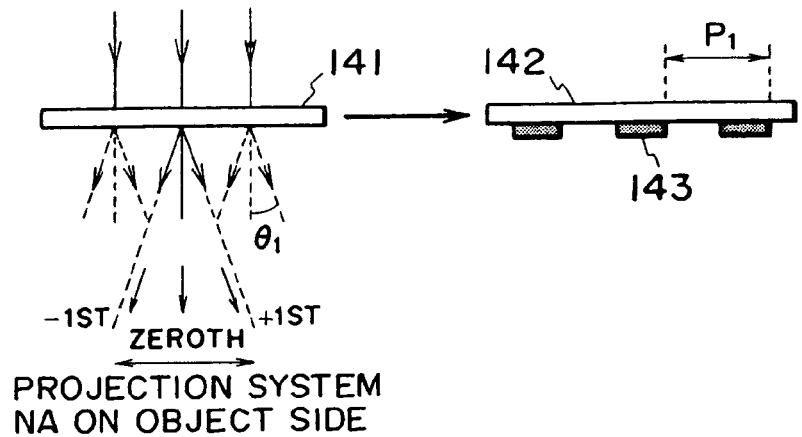
FIGS. 14A, 14B and 14C are schematic views, respectively, for explaining the effect of oblique incidence illumination.
Figure 14B:
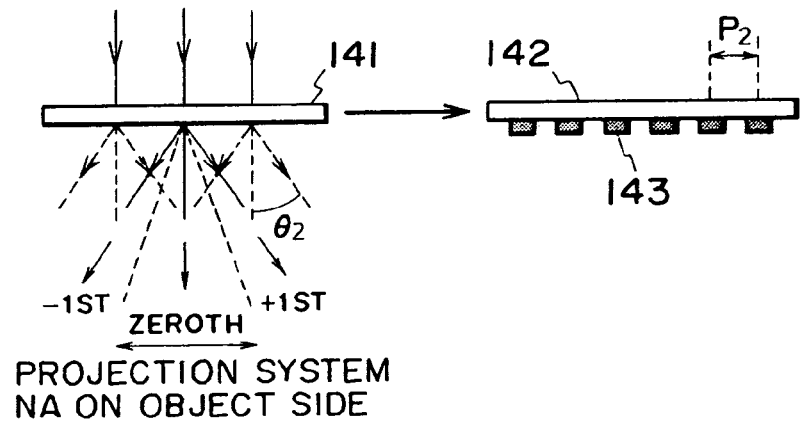
Figure 14C:
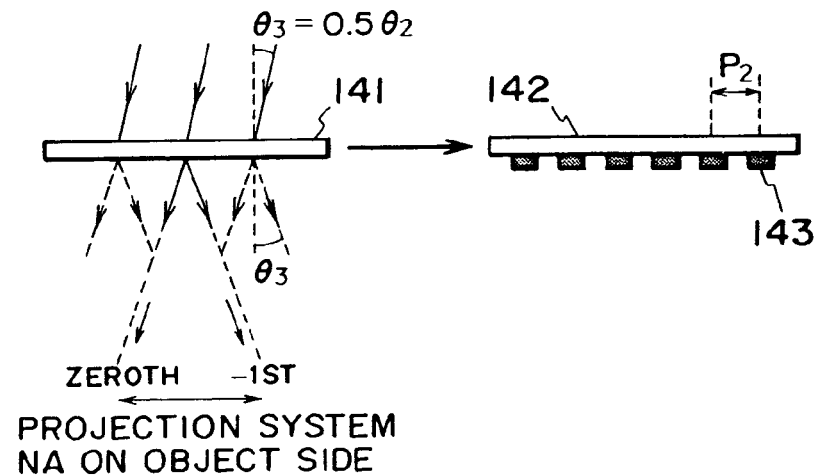
Figure 15:
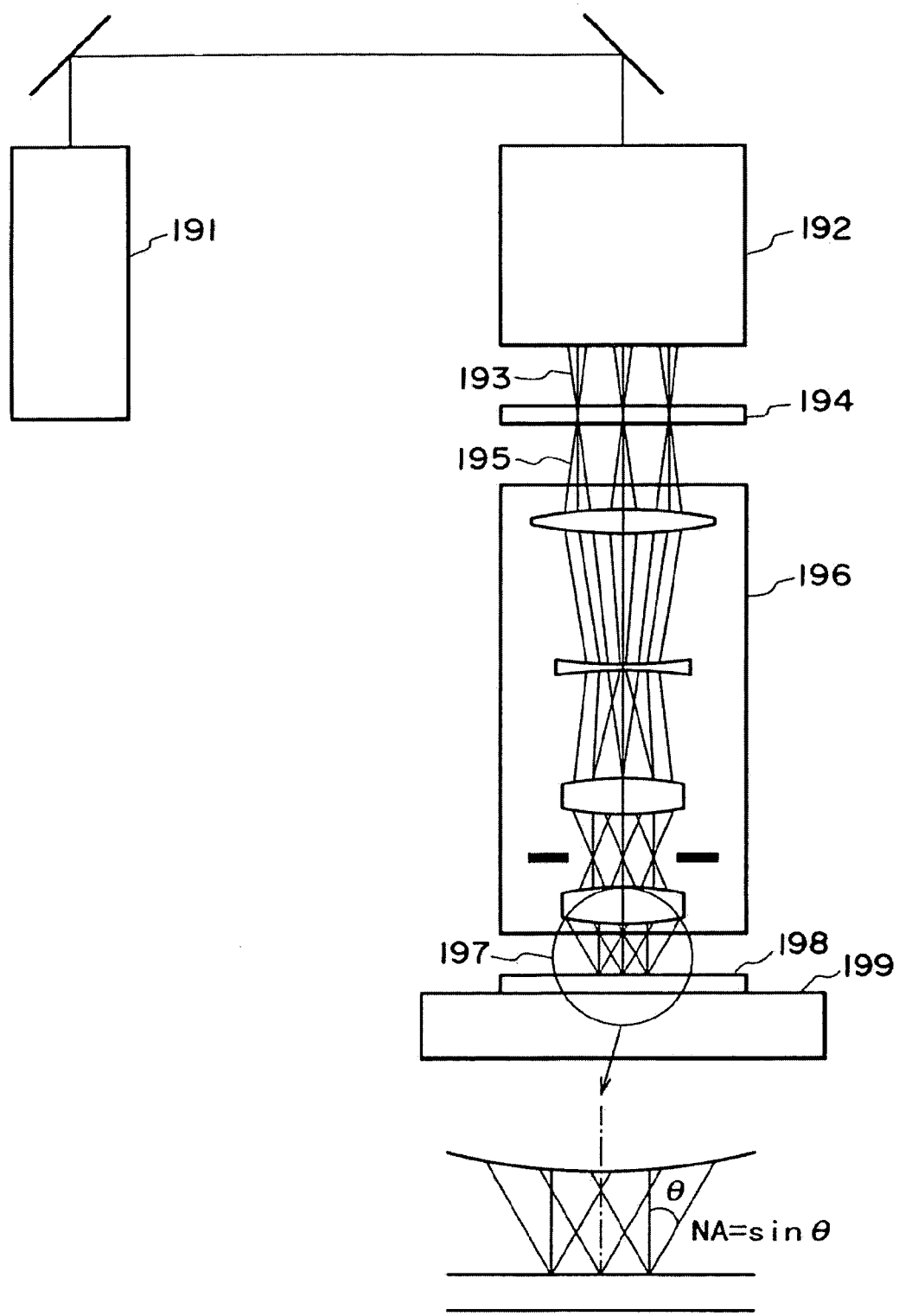
FIG. 15 is a schematic view of an ordinary projection exposure apparatus.

Referring now to FIGS. 14A, 14B and 14C, the effect of the imaging based on the oblique illumination method used in the fine exposure process of this embodiment, will be explained.

FIG. 14A schematically shows the process of exposure of a pattern of a minimum linewidth, with ordinary use of an ordinary exposure apparatus. FIG. 14B schematically shows the process of exposure of a pattern having a frequency twice the limit resolution in the ordinary use, and FIG. 14C schematically shows the process of exposure of a pattern having a double frequency, through the oblique illumination method according to this embodiment.

In FIG. 14A, first order diffractive lights corresponding to pitch P1 of a repetition pattern 143 on a mask 141 somehow enter the opening of the aperture stop of the projection optical system. Namely, the light rays passing through the projection optical system and being contributable to the imaging are three beams of zero-th order light and positive and negative first order diffractive lights. Denoted at 142 is a glass substrate.

In FIG. 14B, pitch P2 of the repetition pattern 143 on the mask 141 is a half of the pitch P1 of FIG. 14A. In this case, the emission angle θ2 of first order diffractive light being diffracted by the mask becomes twice the emission angle θ1 in FIG. 14A. Thus, only zero-th order light can enter the opening of the aperture stop of the projection optical system. That is, the light passing through the projection optical system and being contributable to the imaging is only the zero-th order light which has simply passed through the mask. No image of a line is resolved.

In FIG. 14C, the pattern 143 of a pitch which is a half of the pitch P1 of that shown in FIG. 14A is used, as in the case of FIG. 14B. The incident light is inclined with respect to the optical axis of the projection optical system, such that oblique incidence illumination is performed. The incidence angle θ3 of incident light is a half of the emission angle θ2 of FIG. 14B. In this case, as illustrated, the advancement directions of zero-th order light and positive and negative first order diffractive lights shift obliquely toward the same side, such that the zero-th order light and one of the positive and negative first order diffractive lights (negative first order light in the illustrated example) can enter the opening of the aperture stop of the projection optical system. Thus, these two lights pass through the projection optical system and contribute to the imaging.

Therefore, an image of the line can be resolved. In the imaging through this dual-beam interference, the angle (NA) defined by the imaging plane of the zero-th order light and first order light is twice in the interference angle (NA) of three light beams in the case of ordinary illumination of FIG. 14A. Thus, the resolution is twice the resolution of that shown in FIG. 14A.

The foregoing description applies to one dimension. If the mask is exclusively for use in fine line exposure and it is formed only with a one-dimensional periodic pattern (repetition pattern), the fine line can be printed through the oblique incidence illumination described above. However, generally, a mask is formed with a pattern having two-dimensional directionality, and the aperture stop of a projection optical system has a circular opening. Therefore, the light from the mask is distributed two-dimensionally. For this reason, even with oblique incidence illumination, a resolution of dual-beam interference (FIG. 14C) twice that of ordinary exposure is not attainable.

It is seen from the above that, since what is intended in this embodiment is to perform exposure of a very fine line pattern included in a circuit pattern, such as a gate pattern, under a condition of resolution twice the ordinary resolution or a condition close to it, a single ordinary exposure process of FIG. 14 does not accomplish the purpose completely.

In accordance with investigations made by the inventor of the subject application, it has been found that the purpose can be accomplished satisfactorily by a system wherein, in addition to multiple exposure where, in relation to one and the same pattern, a combination of perpendicular illumination with a large σ and oblique illumination with a small σ is performed. For the oblique illumination, a stop member having an oblong opening effective to selectively transmit diffractive light from a fine line narrower than a resolution limit is used as the aperture stop of the projection optical system.

FIG. 1 shows an embodiment of an exposure apparatus according to the present invention.

In FIG. 1, denoted at 11 is a light source for use in exposure, which comprises a KrF excimer laser (wavelength of about 248 nm), an ArF excimer laser (wavelength of about 193 nm) or an $F_2$ excimer laser (wavelength of about 157 nm), for example. The laser may have a spectroscopic element disposed inside its resonator, if necessary, so that the laser may be used as a band-narrowed laser.

Denoted at 12 is an illumination optical system. At 13, there is a schematic illustration of illumination modes of the illumination optical system 12. Denoted at 14 is a mask having a circuit pattern formed thereon, and denoted at 15 is aperture stop interchanging means for the illumination optical system. Denoted at 16 are aperture stops to be used interchangeably, and denoted at 17 is a reticle stage. Denoted at 18 is a projection optical system which comprises one of a dioptric system, a catadioptric system and a catoptric system.

Denoted at 19 is an aperture stop of the projection optical system, and denoted at 20 is aperture stop interchanging means for the projection optical system. Denoted at 21 is a silicon wafer with a resist, which is a photosensitive substrate. Denoted at 22 is a wafer stage for holding the wafer 21 and being movable two-dimensionally along the optical axis direction of the projection optical system and along a plane perpendicular to the optical axis direction.

This exposure apparatus is based on a step-and-repeat method or a step-and-scan method, and it functions to print the circuit pattern of the mask 14 upon a number of shot regions on the wafer 21 through reduction projection exposure.

When a coarse exposure process such as described above is to be performed with this exposure apparatus, in relation to the mask 14, ordinary partial coherent perpendicular illumination (illumination mode (1) at 13 in FIG. 1) is performed, by use of the illumination optical system 12 with an aperture stop (1) having a circular opening of large NA and large σ (σ=about 0.06 to 0.08) and by use of the projection optical system 18 with an aperture stop (1)' having a circular opening of approximately largest diameter. With this exposure, the pattern of the mask 14 is imaged on the resist of the wafer 2.

Next, when a fine exposure process such as described above is to be performed with this exposure apparatus, in relation to the same mask 14 used in the coarse exposure and while basically keeping the mask 14 and the wafer 21 unchanged, oblique incidence illumination (illumination mode (2) at 13 in FIG. 1) with a small NA and a small σ (σ=0.1 to 0.3) is performed by use of an aperture stop (2) for the illumination optical system 12 together with, in regard to the aperture stop of the projection optical system 18, an aperture stop (2)' having an oblong-shaped opening being elongated in the direction in which zero-th order light and first order diffractive lights are juxtaposed at the aperture stop position (in other words, the direction of repetition of fine lines of the mask 14). By this exposure, a pattern of the mask 14 is imaged on the same (common) region of the wafer 21.

The aperture stop (1) and aperture stop (2) of the illumination optical system 12 can be interchanged with each other by using the aperture stop changing means 16, while the aperture stop (1)' and aperture stop (2)' of the projection optical system can be interchanged with each other by using the aperture stop changing means 21.

Figure 6:
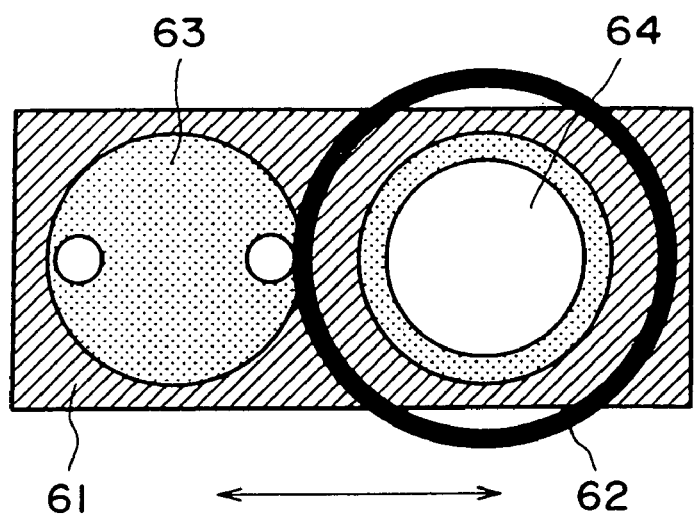
FIG. 6 is a schematic view for explaining an example of aperture stop interchanging means for an illumination optical system.
Figure 7:
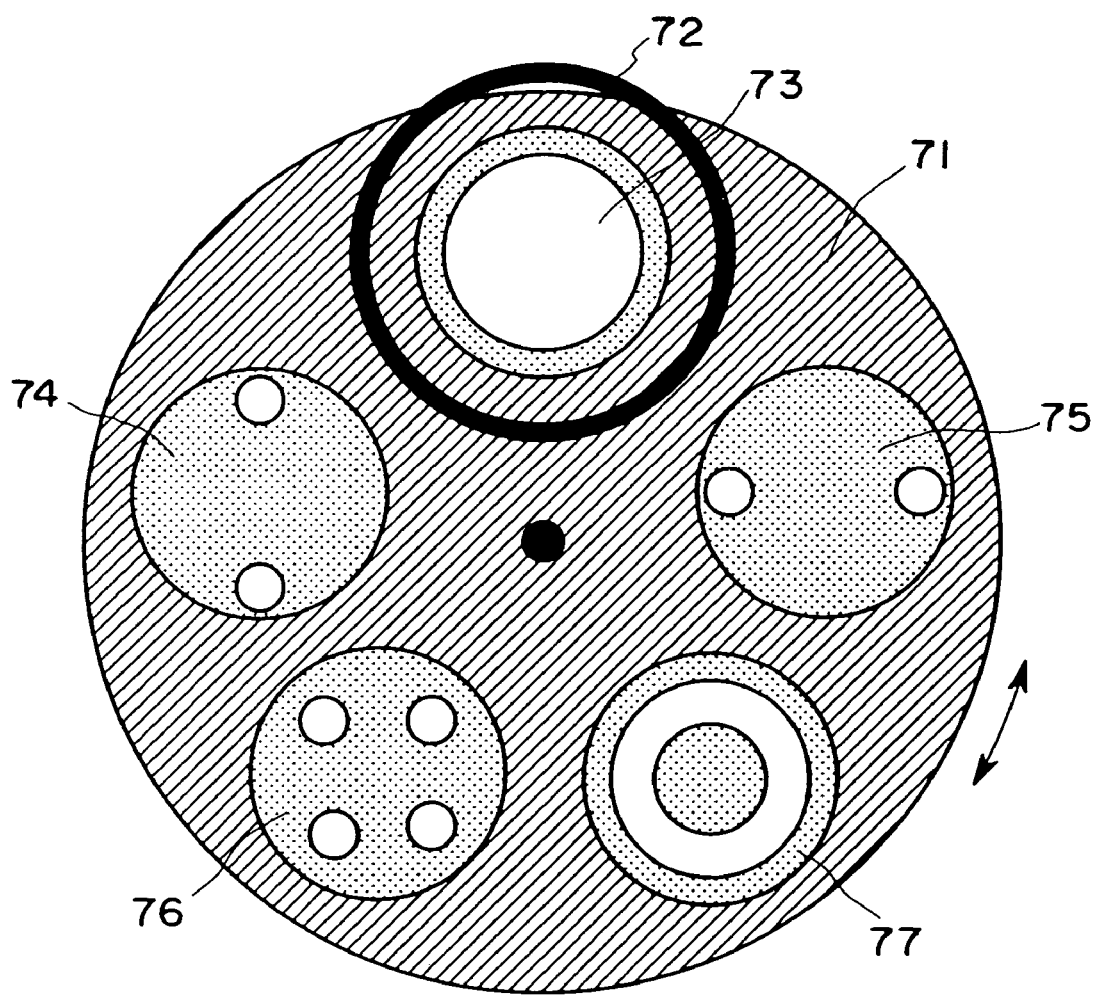
FIG. 7 is a schematic view for explaining another example of aperture stop interchanging means for the illumination optical system.

An example of aperture stop changing means 15 is shown in FIG. 6 wherein two aperture stops (filters) 63 and 64 for fine exposure and coarse exposure, respectively, are fixedly mounted on a single holder 61 and wherein the holder 61 can be moved in parallel to a direction perpendicular to the optical axis of the illumination optical system 12 so that one of the aperture stops is selectively disposed on the light path 62 of the illumination optical system 12. Another example is shown in FIG. 7 wherein a plurality of aperture stops (filters) 73–77 are fixedly mounted on a disk-like holder (turret) 71, which is rotationally moved along a plane perpendicular to the optical axis of the illumination optical system 12, so that one of the aperture stops is selectively disposed on the light path 72 of the illumination optical system 12.

Figure 8:
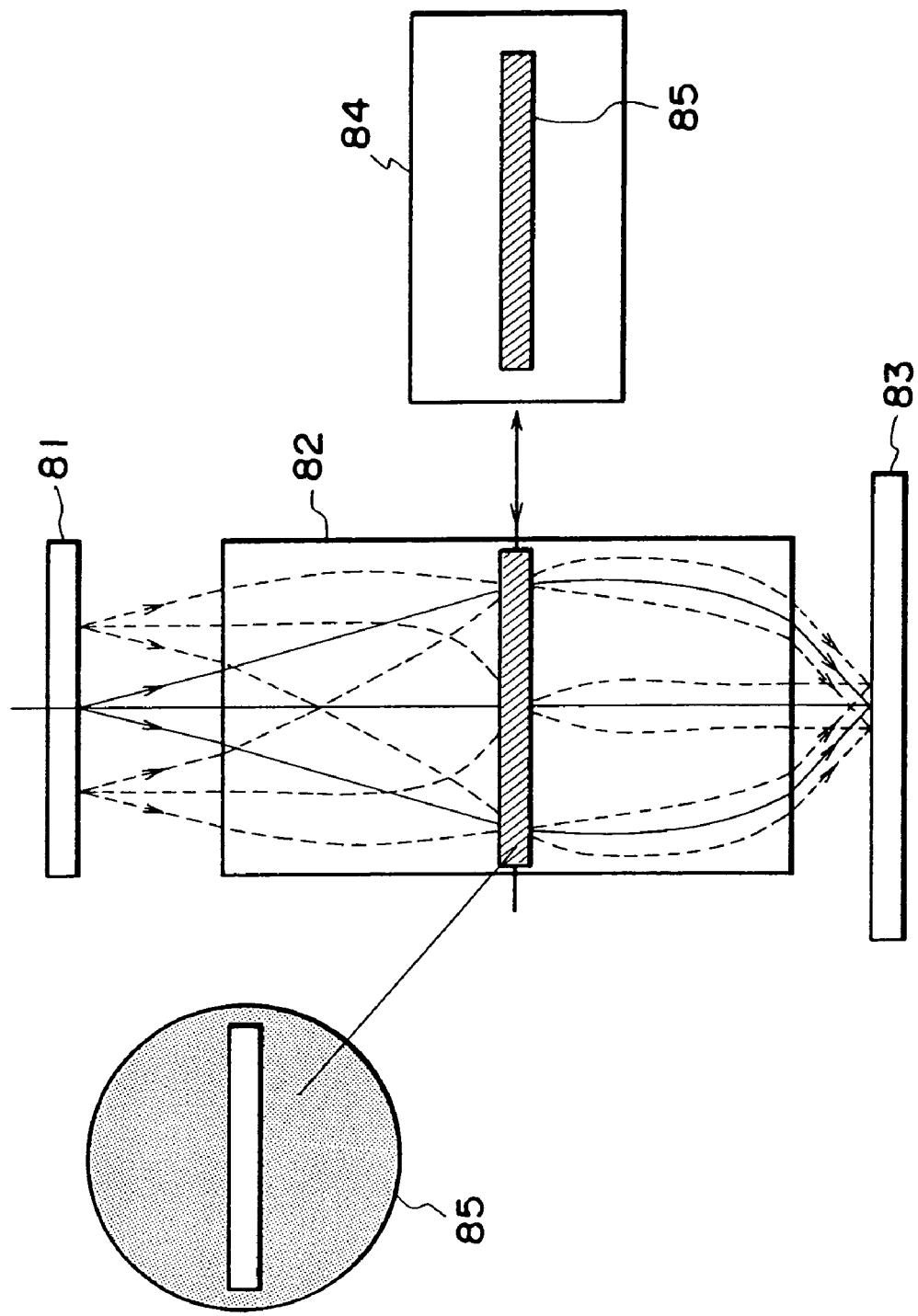
FIG. 8 is a schematic view for explaining an example of aperture stop interchanging means for a projection optical system.
Figure 9:
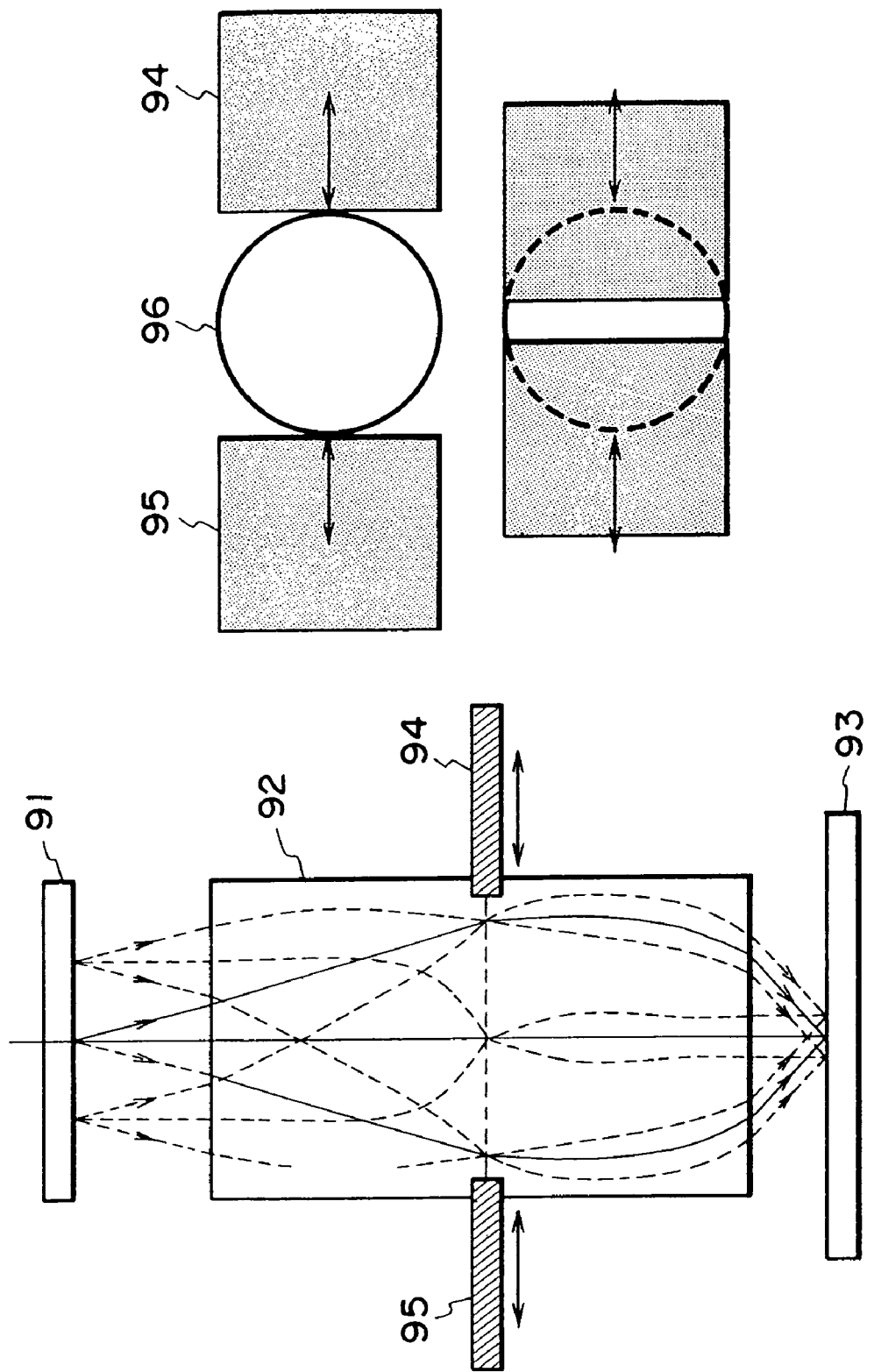
FIG. 9 is a schematic view for explaining another example of aperture stop interchanging means for the projection optical system.

As regards the aperture stop changing means 20, on the other hand, an example is shown in FIG. 8 wherein an aperture stop (filter) 85 having an oblong opening is held by a holder (not shown). For fine exposure, this holder is moved in parallel to a direction perpendicular to the optical axis of the projection optical system 18 so that the aperture stop 85 is inserted and disposed at a predetermined position (pupil position) inside the projection optical system 18. For coarse exposure, the holder is moved in the parallel direction so that the aperture stop 85 is moved together with the holder out of the path of the projection optical system. Another example is shown in FIG. 9 wherein two light blocking blades 95 are moved from the outside of the projection optical system 18, and in parallel to a direction perpendicular to the optical axis of the projection optical system 18, so that they are inserted and fixed at predetermined positions by which an oblong opening is defined at the center of the light path.

Figure 10A:
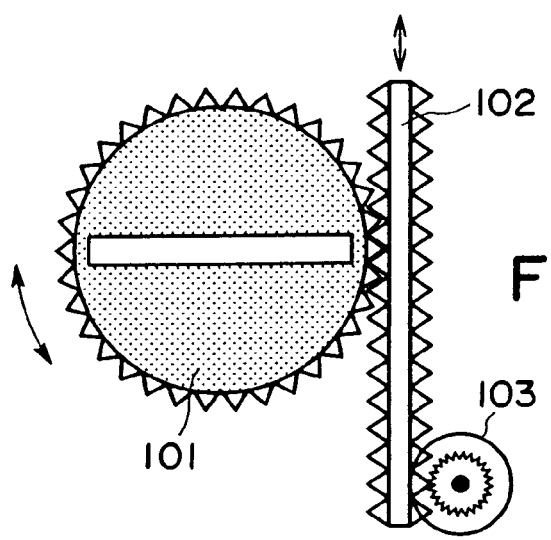
FIGS. 10A and 10B are schematic views, respectively, for explaining an example of aperture stop rotating means for a projection optical system.
Figure 10B:
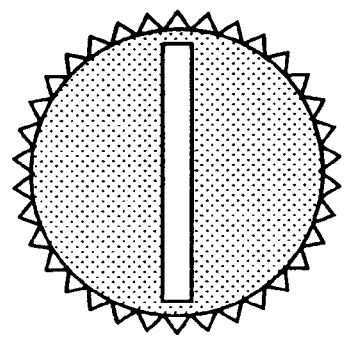

A further example is shown in FIGS. 10A and 10B, wherein mechanisms 102 and 103 may be used to move or rotate the holder and aperture stop of FIG. 8, or to rotate the two light blocking blades and blade inserting/extracting means may be used. This may be used in embodiments to be described later.

The preceding embodiment is arranged to perform dual exposure (two exposures under different conditions without a development process intervening) for an integrated gate pattern. Next, an embodiment arranged to perform triple exposure, for an integrated gate pattern, will be explained.

Figure 11:
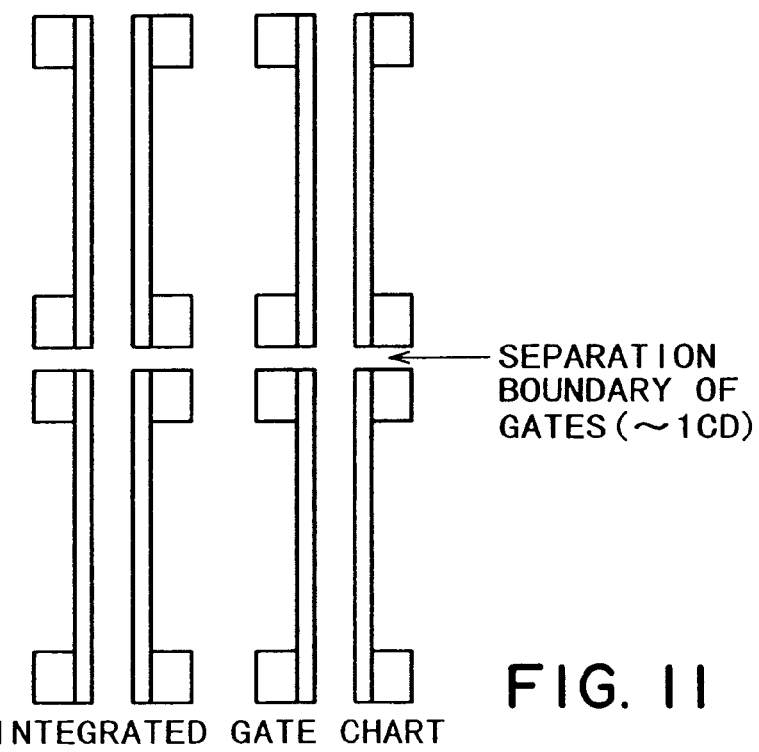
FIG. 11 is a schematic view of an example of an integrated gate chart.

This embodiment is directed to an example of an exposure method and an exposure apparatus more suited to a case where gate patterns are integrated, as shown in FIG. 11. A projection exposure apparatus shown in FIGS. 1, 7 or 10 may be used in this embodiment.

Figure 12:
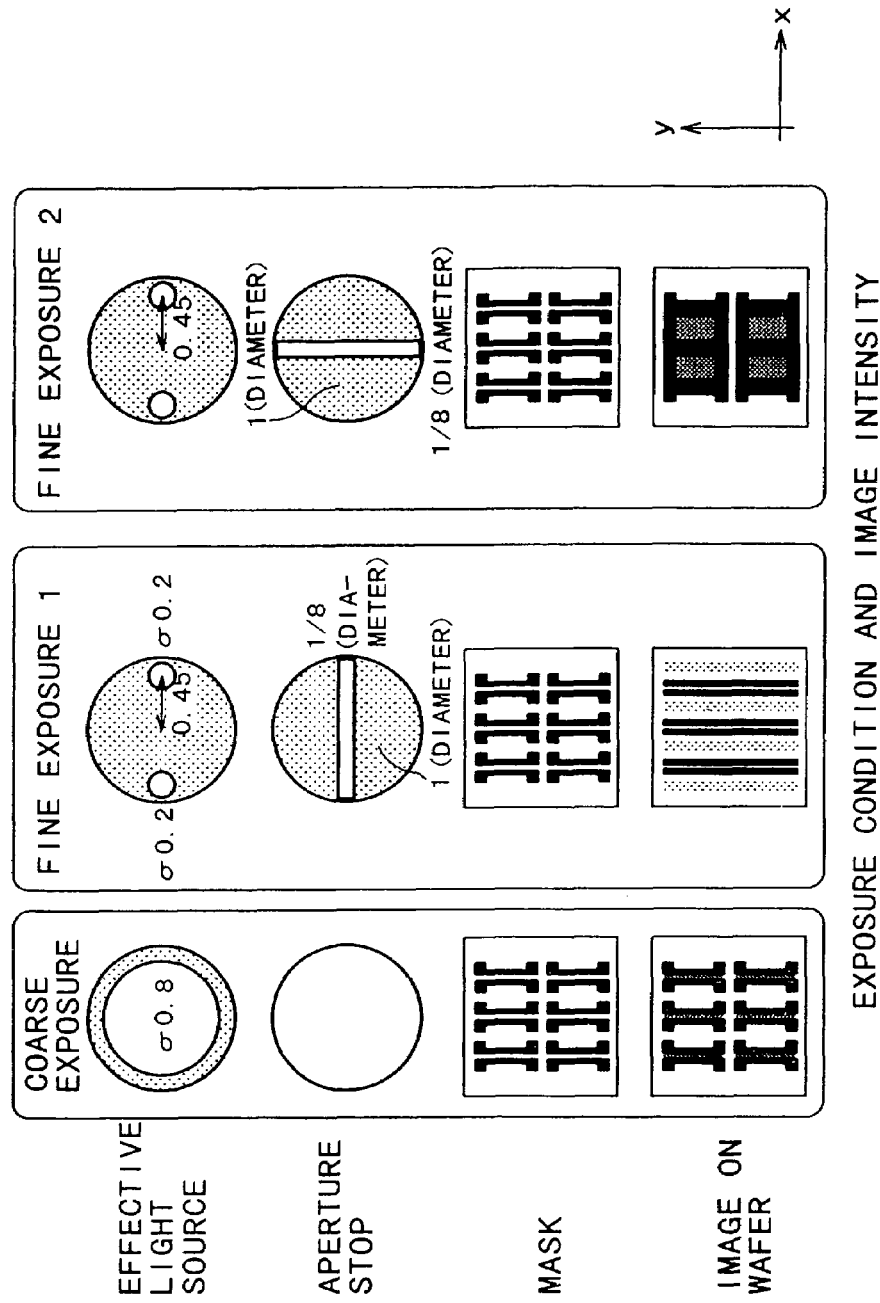
FIG. 12 is a schematic view for explaining an exposure condition and image intensity, in a second embodiment of an exposure method according to the present invention.

As shown in FIG. 12, in this embodiment, a triple exposure process including a coarse exposure (left hand side), a first fine exposure #1 (center) and a second fine exposure #2 (right hand side) is performed, by which separation boundaries between the gate patterns in the X and Y directions can be enhanced.

The coarse exposure and first fine exposure #1 of this embodiment are performed basically in a similar manner as has been described with reference to the embodiment of FIG. 4, although there is a difference in exposure amount. The second fine exposure #2 is similar to the first fine exposure #1 in that oblique incidence illumination with a dual-pole effective light source being formed and spatial frequency adjustment (filtering) through an aperture stop having an oblong opening are performed. However, in this exposure process, while keeping the mask pattern, the orientation of the oblong opening of the aperture stop (and the orientation of the effective light source, if necessary) is rotated by 90 degrees from the position in the first fine exposure #1. This accomplishes improvement of resolution in the Y direction (vertical direction as viewed in the drawing) with respect to which higher resolution is required as a result of the integration. Further, because it differs from the direction of oblique incidence illumination, a more desirable intensity distribution can be produced.

The present invention is not limited to the embodiments described above, and the exposure sequence, for example, may be modified within the scope of the invention.

Figure 13:
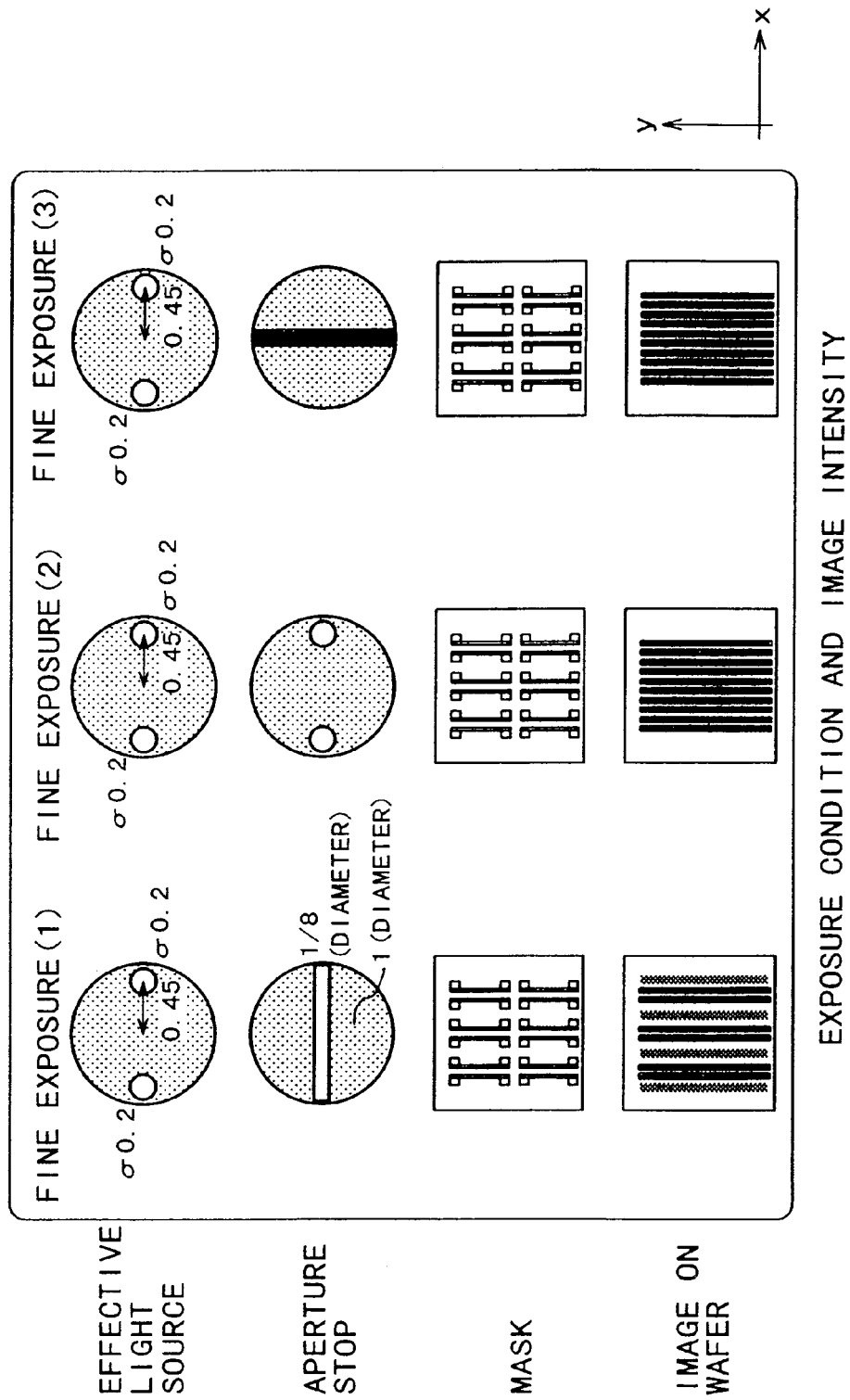
FIG. 13 is a schematic view for explaining another embodiment of fine exposure.

Particularly, the shape of the opening of the aperture stop of the illumination optical system 12 or the shape of the opening of the aperture stop of the projection optical system 18 may be determined as desired in accordance with a circuit pattern to be transferred to a wafer. For example, as regards the aperture stop 16 for the illumination optical system, a stop with a ring-like opening (stop 77 in FIG. 7) or a stop with four openings at off-axis positions (stop 76 in FIG. 7) may be used. As regards the aperture stop 19 for the projection optical system 18, a stop with an elliptical opening or a stop with four openings at off-axis positions may be used. In relation to this, FIG. 13 shows modified forms (1)–(3) of fine exposure.

In accordance with the embodiments described above, a circuit pattern having a pattern of a linewidth narrower than the limit resolution of the apparatus can be transferred to a wafer in accordance with dual exposure or a triple exposure process, by using an ordinary projection exposure apparatus and a single mark, or with a small modification thereto. There is not a necessity of movement of a wafer between different apparatuses, or replacement of masks. The time necessary for dual exposure or triple exposure can, therefore, be reduced significantly.

Next, an embodiment wherein coarse exposure and fine exposure can be performed, without changing the aperture shape of an aperture stop for a projection optical system, will be explained. This embodiment concerns an exposure method which may use a projection exposure apparatus shown in FIG. 1 or FIG. 7.

In accordance with this embodiment, a circuit pattern having a fine isolated pattern of a linewidth narrower than the resolution limit of the exposure apparatus is provided with an auxiliary pattern annexed thereto. To this circuit pattern with an auxiliary pattern, dual exposure based on coarse exposure with a large σ and through perpendicular illumination and fine exposure with a small a and through oblique illumination is performed, without a development process interposed. Through the coarse exposure, a larger pattern more than $0.5\lambda/NA$ or less is resolved with priority. Here, $\lambda$ is the wavelength of exposure light, and NA is the object side numerical aperture of the projection optical system.

In this embodiment, the aperture stop of the projection optical system 18 may use an aperture stop (1)' (FIG. 1) with a circular opening for both of the coarse exposure and fine exposure. As regards aperture stops of illumination optical system 12 to be used interchangeably, an ordinary stop 73 (FIG. 7) with a central circular opening may be used for the coarse exposure, while a stop 76 (FIG. 7) with four off-axis openings or a stop 77 with a ring-like opening may be used for the fine exposure. These aperture stops of the illumination optical system 12 may be interchanged in accordance with the methods described with reference to the preceding embodiments.

Figure 17:
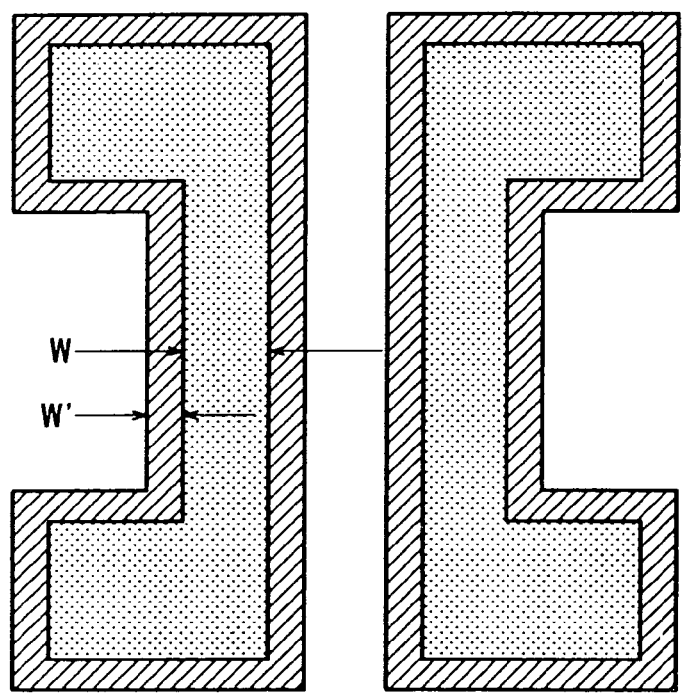
FIG. 17 is a schematic view for explaining another example of a gate pattern with an auxiliary pattern, to be used in the third embodiment of an exposure method according to the present invention.
Figure 18:
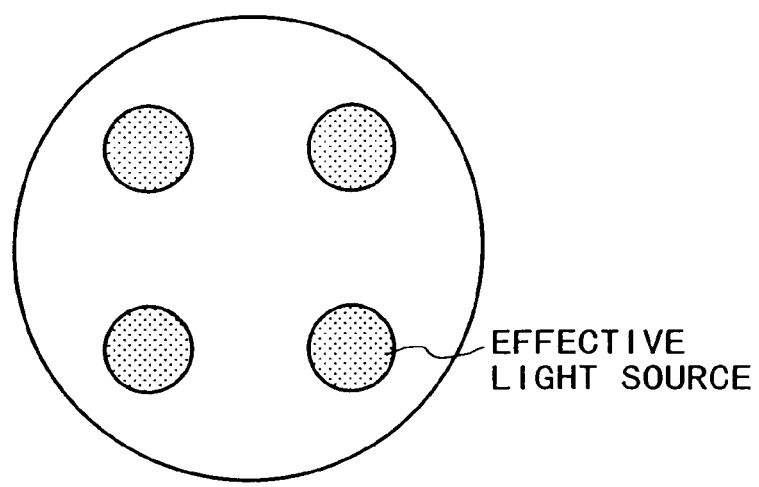
FIG. 18 is a schematic view for explaining an example of an effective light source.
Figure 19:
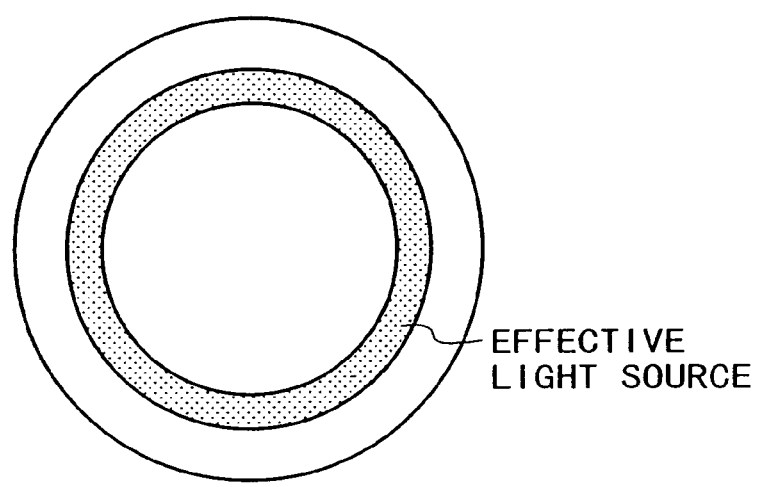
FIG. 19 is a schematic view for explaining another example of an effective light source.

FIG. 17 shows an image of the aperture of the stop 76, that is, an effective light source. Similarly, FIG. 18 shows an effective light source by an image of the aperture of the stop 77, and FIG. 19 shows an effective light source by an image of the aperture of the stop 73. These aperture images are produced at the opening (pupil) of the aperture stop of the projection optical system, with zero-th order light.

Provision of an auxiliary pattern will be described in detail.

An auxiliary pattern may be added to an isolated fine pattern of a linewidth W not greater than $0.5\lambda/NA$. Here, for a fine pattern which is isolated only on one side, an auxiliary pattern may be added to the one side. The linewidth W' of the auxiliary pattern may be about 0.25λ/NA or less. The spacing S between the fine pattern and the isolated pattern may effectively be made equal to or close to the value of the linewidth W'.

If there are fine patterns which constitute a repetition pattern or there are many fine patterns disposed close to each other so that the addition of an auxiliary pattern is difficult to accomplish, no auxiliary pattern may be added.

The phase of the auxiliary pattern (the phase of exposure light passing therethrough) may be reversed with respect to the phase of the subject pattern (phase of exposure light passing therethrough), to provide a rim type phase shift mask. On that occasion, if the subject fine pattern comprises a light transmissive portion while the portion around it comprises a light blocking portion, the phase of the auxiliary pattern may be inverted with respect to the fine pattern. If the subject fine pattern comprises a light blocking portion while the portion around it comprises a light transmissive portion, the phase of the auxiliary pattern may be reversed with respect to the portion around the fine pattern.

Figure 16:
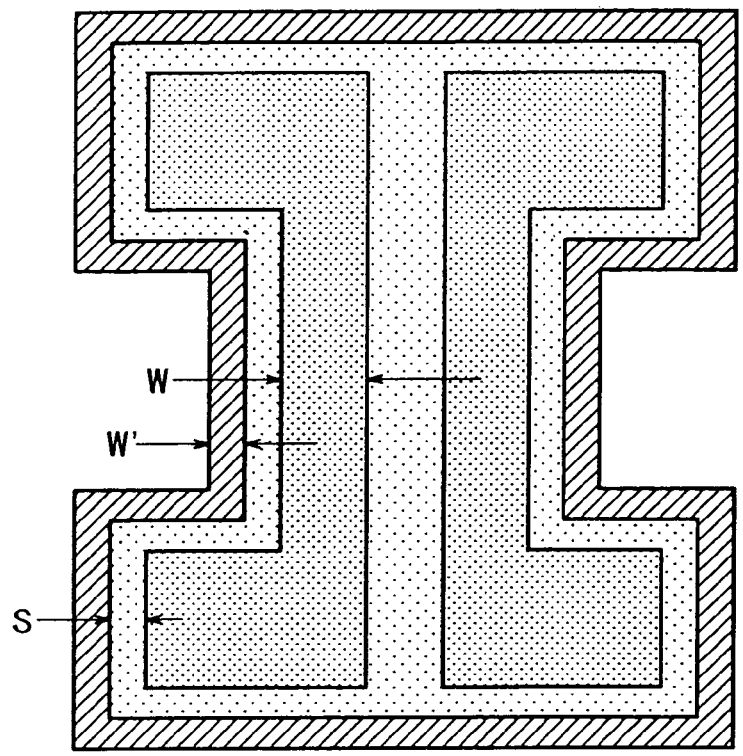
FIG. 16 is a schematic view for explaining an example of a gate pattern with an auxiliary pattern, to be used in a third embodiment of an exposure method according to the present invention.

FIG. 16-1 shows an example wherein an auxiliary pattern is added to two fine lines of width W of gate patterns, having been described hereinbefore. In this example, a pair of gate patterns are surrounded by an auxiliary pattern of a width W', with a spacing S kept therebetween. FIG. 16-2 shows an example wherein a rim type auxiliary pattern (hatched portion) of a width W' is added to a fine line of a gate pattern, with the phase being inverted with respect to the light transmissive portion.

Figure 20:
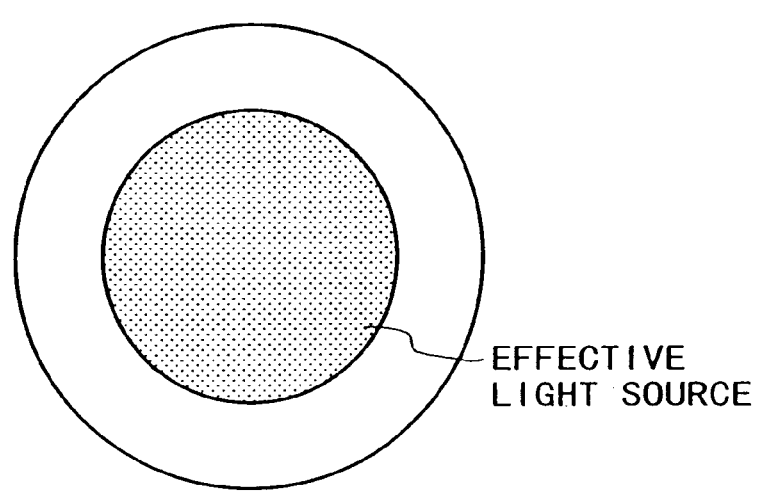
FIG. 20 is a schematic view for explaining a further example of an effective light source.

FIG. 20 shows the result of dual exposure according to the exposure method of this embodiment.

Here, the dual exposure was performed by use of a projection exposure apparatus having an image side numerical aperture NA of 0.6 and exposure light of a wavelength λ=248 nm. The result shown in FIG. 20 is provided, like that of FIG. 16-1, by using a mask with a gate pattern having a fine line of W=0.12 micron and an auxiliary pattern of W'=0.03 micron being added around the gate pattern.

Figure 21:
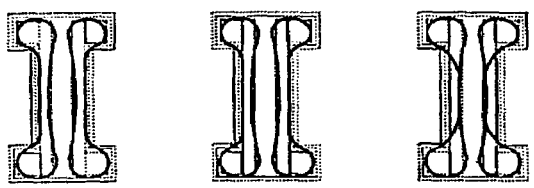
FIG. 21 is a schematic view for explaining the effect of dual exposure, to be done in the third embodiment of the present invention.
Figure 21:
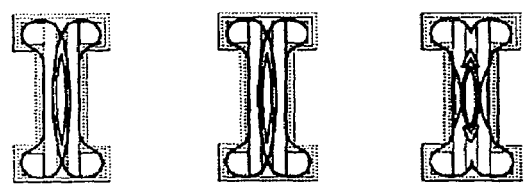
Figure 21:
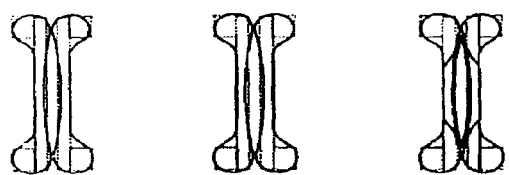

In FIG. 21, the upper row shows the results when the fine exposure was performed with illumination light for forming the effective light source of FIG. 17. The middle row shows the results when the coarse exposure was performed with illumination light for forming the effective light source of FIG. 19. The bottom row shows the results when dual exposure of fine and coarse exposures was performed.

As shown in the drawing, with the coarse exposure, two fine lines are not resolved by exposure and there is defocus remaining. With the fine exposure, on the other hand, the two fine lines are resolved, but the spacing between these two lines is too large so that a shape necessary for a gate pattern is not produced. With the dual exposure, as compared, two fine lines are resolved and, also, a shape necessary for a gate pattern is produced.

Also, in accordance with this embodiment, a circuit pattern having a pattern of a linewidth narrower than the limit resolution of the apparatus can be transferred to a wafer in accordance with a dual exposure process, by using an ordinary projection exposure apparatus and a single mask, or with a small modification thereto. There is no necessity of movement of a wafer between different apparatuses, or replacement of masks. The time necessary for dual exposure or triple exposure can be reduced significantly.

In the embodiments described above, when dual exposure of coarse and fine exposure processes is to be performed to a number of shot regions on a wafer, these two exposure processes may be done with respect to each shot. Alternatively, one exposure process may be performed to all the shots of one wafer or of plural wafers of one lot and, after that, the other exposure process may be done to the one wafer or the plural wafers without a development process interposed.

The illumination lights to be used in these two exposure processes may comprise rectilinearly polarized lights having their polarization directions set orthogonal to each other, not interfering with each other, and these two exposure processes may be done simultaneously.

The present invention is applicable to both positive type and negative type resist materials.

Next, another embodiment of the present invention will be described.

The principle of an exposure method in this embodiment is as follows. Control of a spatial frequency spectrum of a Levenson type mask through an illumination condition and control of a spatial frequency spectrum of a projection optical system are combined with each other, so as to extract a spatial frequency component with which dual-beam interference can be substantively produced, such that a very fine linear pattern included in the mask and being unable to be resolved by ordinary exposure, can be printed on a resist of a wafer independently, by exposure based on a dual-beam interference condition best suited for that pattern. A latent image is then superposedly formed thereon, by ordinary exposure. On the basis of the thus accumulated latent images, a development process is performed, whereby a desired pattern is produced.

With this multiple exposure process, various fine patterns included in a single mask can be transferred with the limit performance of a projection optical system, such that the performance of the projection exposure apparatus having been restricted in a simple single-exposure can be best utilized.

Thus, with a KrF excimer laser projection exposure apparatus with a numerical aperture (NA) of 0.6, even a pattern of linewidth 0.1 micron can be printed. The resolution is thus about twice that of a 0.2 micron pattern, which is usually the limit linewidth. Further, there is an advantage of uniformess of the fine line portion or enlargement of the depth of focus.

In this embodiment, like the preceding embodiments, only a single mas is necessary for the multiple exposure. This is effective to reduce the cost of the mask itself, and it avoids complicated works for mask replacement or mask alignment operation required thereby, which are factors for decreased throughput.

The flow chart of FIG. 2 also shows the procedure of an exposure method according to this embodiment. The flow chart of FIG. 2 includes a coarse exposure step for projection exposure of a pattern of a relatively large linewidth, a fine line exposure step for projection exposure of a pattern of a relatively small linewidth, and a development step.

The order of the coarse and fine-line exposure steps is not limited to that illustrated. The fine-line exposure may be performed first. If the exposure steps are repeated, the coarse and fine exposures may be done alternately.

A wafer alignment step of a known process may be interposed between these exposure steps, if necessary. This may be effective to improve the image formation precision. Thus, in this embodiment, the sequence and procedure are not limited to those shown in FIG. 2.

The principle of multiple exposure based on these exposures will be described in detail. When the procedure is to be performed in accordance with the flow of FIG. 2, first, a coarse exposure is performed by which an image of a desired pattern of a mask is printed on a wafer.

Since what is intended in this embodiment is to perform exposure with a resolution narrower than the limit linewidth, which can be resolved by a projection optical system, the desired pattern formed on the mask includes a pattern corresponding to the linewidth narrower than the limit linewidth above.

Figure 22:
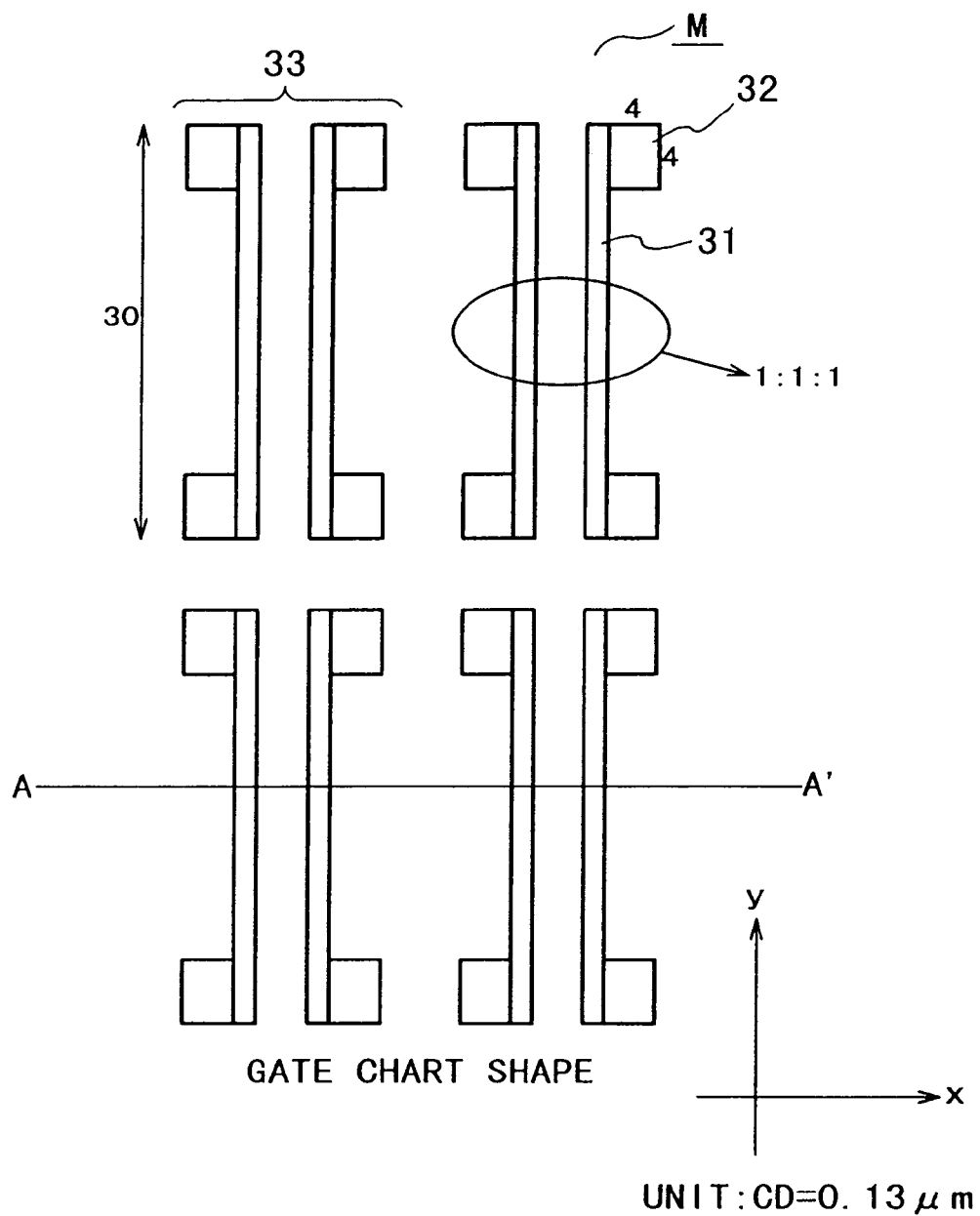
FIG. 22 is a schematic view for explaining a gate pattern shape to be used in another embodiment of the present invention.

FIG. 22 shows an example of such a pattern formed on a mask. In FIG. 22, denoted at 33 is a basic pattern, and denoted at 31 and 32 are light transmissive portions (lines). The basic pattern 33 is formed repeatedly, whereby a repetition pattern is formed. This pattern is one called a gate pattern to be used in an ASIC of a semiconductor device.

Denoted in the drawing at 31 is a gate line, which is a main portion for playing the function of switching. Minimization of the linewidth of this portion has been desired. On the other hand, denoted at 32 is a writing contact portion. Since this portion 32 needs an area of a certain extent, it is larger in size than the gate line 31. Thus, this gate pattern includes a mixture of a fine line and a pattern relatively larger than it. Since gate patterns should be integrated as densely as possible from the viewpoint of IC function, the spacing 9 between the patterns may be set equal to the width a of the fine line pattern.

Figure 24:
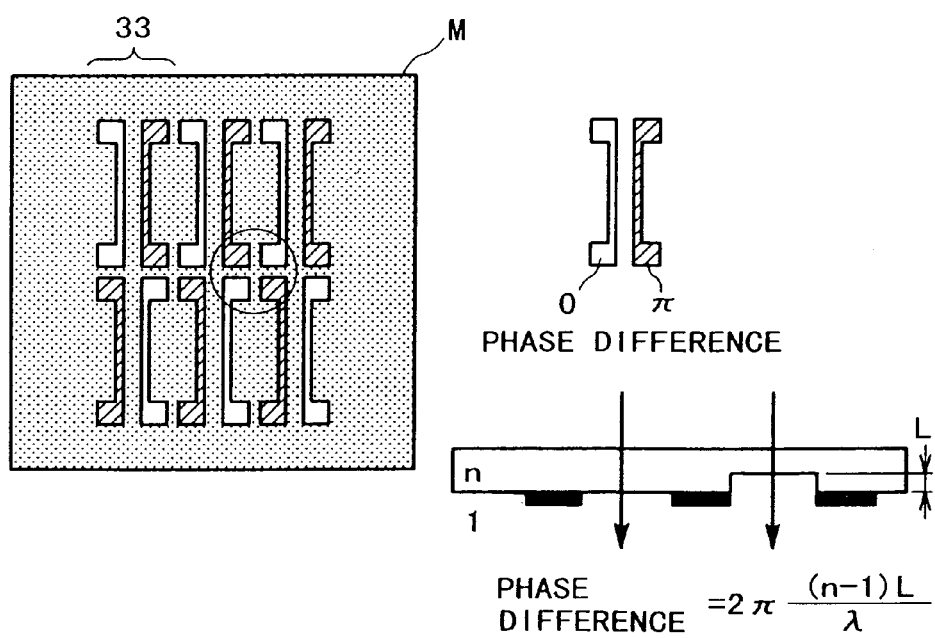
FIG. 24 is a schematic view for explaining an example of a Levenson type mask to be used in a further embodiment of the present invention.

FIG. 24 is a schematic view of a mask M to be used in this embodiment. Since the gate pattern 33 comprises a pair of patterns, the mask M is so manufactured that the phase difference between the lights passing through this pair of patterns becomes approximately equal to $\pi$ (180 degrees). Also, in this drawing, there is a phase difference of 180 degrees between the blank portion and the hatched portion.

Further, the mask is so manufactured that there is a phase difference of $\pi$ between adjacent patterns at upper and lower rows of the gate pattern, as illustrated. With this structure, light is attenuated by the phase difference, at the boundary between adjacent patterns, and there is an advantage of improvement of resolution of pattern image.

However, only with coarse exposure, use of a Levenson type mask, such as above, does not result in complete resolution of fine lines narrower than the limit linewidth, such as the gate line portion, for example. Further, the depth of focus is shallow. It is to be noted that "approximately 180 degrees" refers to 180±10 degrees.

Subsequently, as a second step, a fine line exposure process is performed to the photosensitive substrate having been exposed by coarse exposure. No development process is performed yet.

In the fine line exposure, while the mask M position is kept at the same position in the coarse exposure, the illumination condition of an illumination optical system 12 and the aperture stop of a projection optical system 18 are adjusted and, thereafter, the exposure process is performed.

Figure 23:
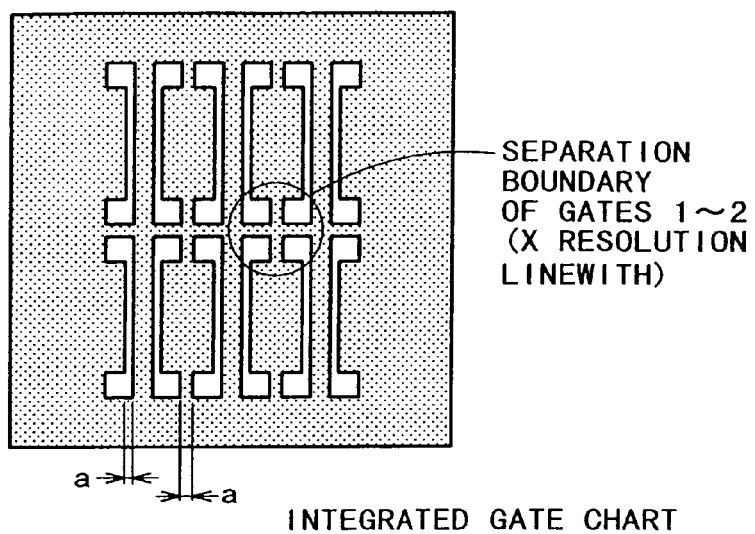
FIG. 23 is a schematic view of an integrated gate chart shape.
Figure 25:
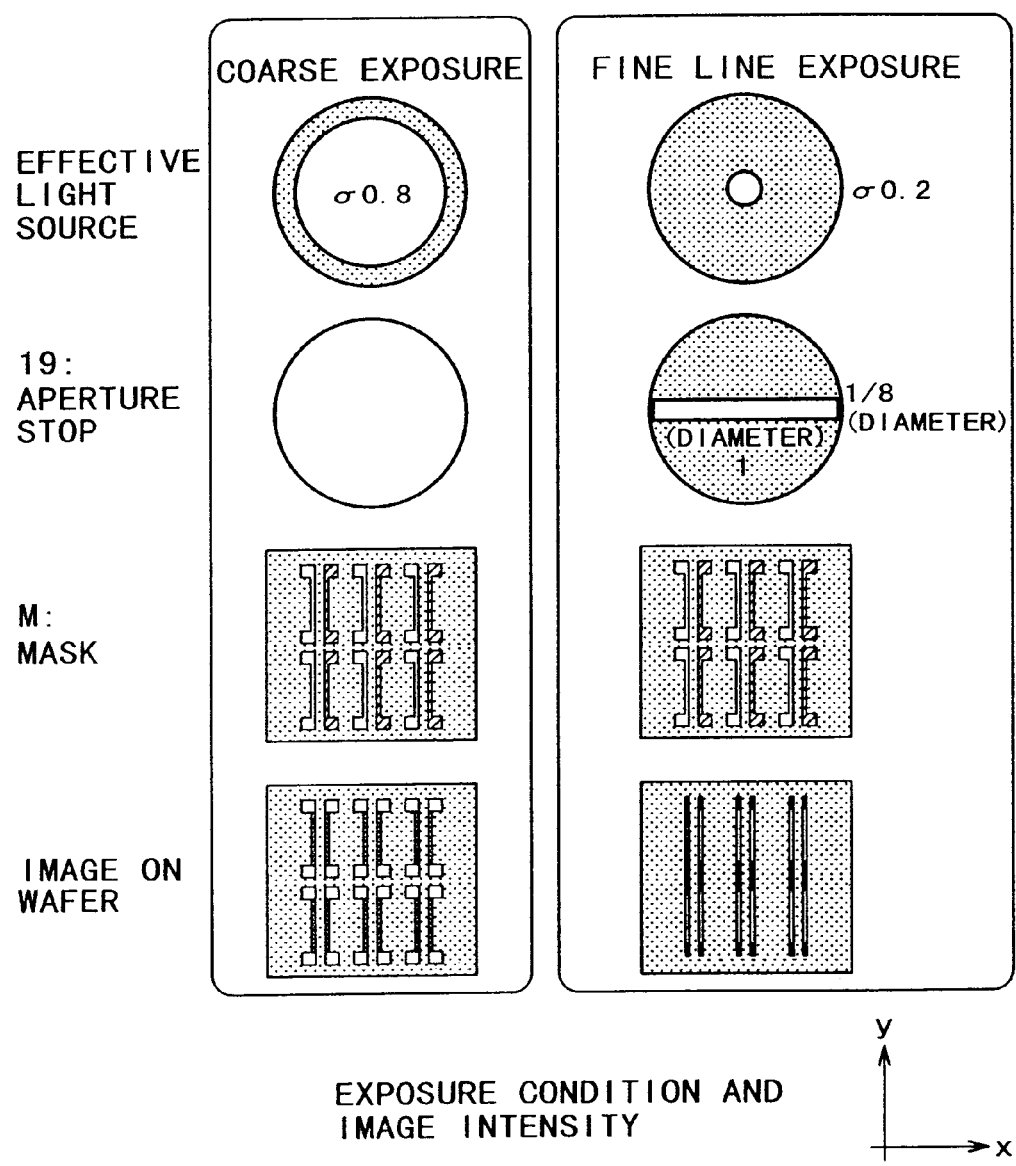
FIG. 25 is a schematic view for explaining an exposure condition and image intensity, in a further embodiment of the present invention.

FIG. 25 is a schematic view for explaining exposure conditions in respective exposure steps as well as patterns obtainable from these exposures. As regards the illumination condition for fine line exposure, a stop, or the like, may be disposed in the illumination optical system 12 (FIG. 1) to provide small a illumination (illumination close to coherent illumination) shown at the right hand side of FIG. 25. As regards the aperture stop to be provided at the pupil plane of the projection optical system, a stop having an oblong opening, such as shown at the middle portion of the drawing, is used. The mask M has a similar structure as shown in FIG. 23.

The X and Y axes in the drawing are in alignment with X and Y axes of the gate pattern (FIG. 3).

Figure 26:
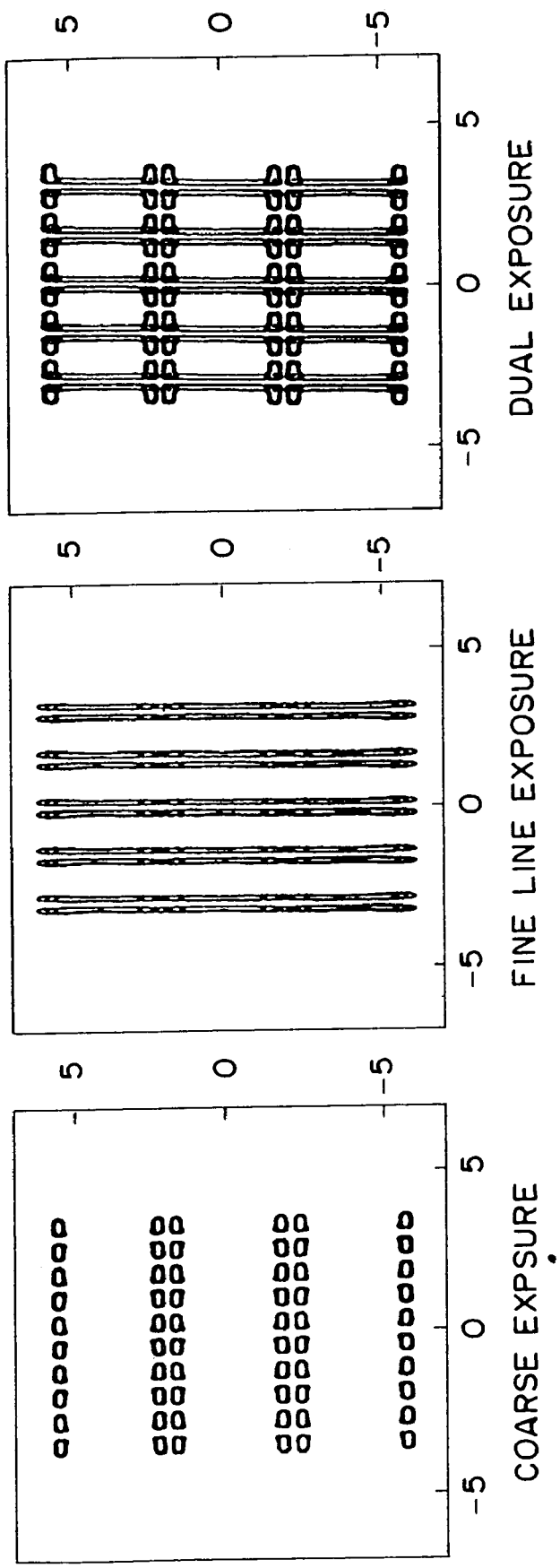
FIG. 26 is a schematic view for explaining the light intensity distribution of a pattern image in the embodiment of FIG. 25.

FIG. 26 shows examples of light intensity distributions of patterns defined by exposures of FIG. 25. The light intensity distribution of the gate line portion of the gate pattern shown in FIG. 22 (A–A' in the drawing) is approximately the same as that shown in the upper row of FIG. 5.

The results shown in these drawings are those from negative exposures. Illustrated from left to right are the result of coarse exposure, the result of fine-line exposure and the integrated result of dual exposure.

It is seen from FIG. 26 that the fine line portion is not resolved by coarse exposure, and there is a defocus image. The light intensity is low as compared with the intensity at the contact portion. The fine line exposure has resolved the gate line portion satisfactorily. There is a further advantage that, even with respect to the gate line direction, light is concentrated to the portion where a gate line is present.

The light intensity defined finally by integration through multiple exposure is that at the right hand portion of the drawing. It is seen that a pattern image as desired is reproduced satisfactorily.

Also, it is seen in FIG. 5 that the range of permissible exposure amount (exposure latitude) with which a gate line can be printed is narrow only with coarse exposure, whereas, in accordance with the dual exposure integration, a light intensity distribution of a gate line pattern having a large contrast is added through the fine line exposure such that the range of permissible exposure amount is extended to be about double.

Thus, with the multiple exposure procedure of this embodiment, wherein the mask, the illumination condition and the aperture stop are adjusted as described above, an image of a pattern of a higher resolution beyond an ordinary resolution limit of an exposure apparatus can be printed by projection exposure stably.

FIGS. 27A, 27B and 27C are schematic views, respectively, for explaining the effect of exposure based on a Levenson type mask (Levenson type phase mask) used in the fine line exposure of this embodiment.

FIG. 27A schematically shows the process of exposure when an ordinary exposure apparatus is used for limit reduction. FIG. 27B schematically shows the process of exposure of a pattern of a pitch twice the limit resolution in the ordinary use, and FIG. 27C schematically shows the process of exposure of a pattern double pitch, by use of a Levenson mask of this embodiment.

Denoted at 171 is a light blocking portion made of chromium, and denoted at P1 and P2 are pitches of periodic patterns.

These cases will be explained separately.

In FIG. 27A, first order diffractive lights (angle θ) corresponding to pitch P1 of lines on the mask M just enter the object side numerical aperture NA of the projection optical system. Namely, the light rays passing through the projection optical system and being contributable to the imaging are three beams of zero-th order light and positive and negative first order diffractive lights.

In FIG. 27B, pitch P2 of the line pattern on the mask M is twice the pitch P1. In this case, the angle θ2 of first-order diffractive light being diffracted by the mask becomes twice the angle θ1 of FIG. 27A. Thus, only zero-th order light can enter the object side numerical aperture NA of the projection optical system. That is, the light passing through the projection optical system and being contributable to the imaging is only the zero-th order light which has simply passed through the mask. No image of a line pattern (repetition of lines and spaces) is resolved, in this case.

In FIG. 27C, a pattern of pitch P2 twice the pitch shown in FIG. 27A is used, as in the case of FIG. 27B, but the mask comprises a Levenson type mask. In this case, as illustrated, zero-th order light and positive and negative first order diffractive lights shift obliquely, such that the zero-th order light and the positive first order diffractive light (or zero-th order light and negative first order light) can enter the object side numerical aperture NA of the projection optical system. Thus, these lights pass through the projection optical system and contribute to the imaging.

This is dual-beam interference. In this case, the angle (NA) defined by the imaging plane of the zero-th order light and positive first order light is twice the interference angle (NA) of three light beams in the case of ordinary illumination. Thus, the resolution is twice.

The foregoing description applies to one dimension. If the mask is exclusively for use in fine line exposure and it is formed only with a one-dimensional periodic pattern, the fine line can be printed only by use of a Levenson mask described above. However, a mask may be formed with a two-dimensional pattern other than a fine line and the aperture stop may have a circular opening. On that occasion, the diffractive light is distributed two-dimensionally on the plane of the aperture stop. For this reason, even if a Levenson mask is used, the imaging is based on various two-dimensional angles (numerical apertures), such that a resolution of dual-beam interference twice that of ordinary exposure is not attainable. It is seen from the above that, with the structure described above, it is difficult to perform exposure of a very fine line pattern, included in a pattern, with double resolution.

Also, in this embodiment, in consideration of the above, a projection exposure apparatus such as shown in FIG. 1, 6, 7, 8, 9 or 10 is used and an aperture stop having an oblong opening is disposed at the aperture stop plane of the projection optical system. This effectively restricts the light having a mixture of various two-dimensional angles, to one dimension for resolution of a fine line, such that one-dimensional imaging with approximately dual beams corresponding to the fine line is accomplished. The exposure apparatus of FIG. 1 may be provided with a stop (not shown) with a circular opening of σ=0.2, for the fine line exposure.

A further embodiment of the present invention will now be described.

This embodiment is directed to an exposure method suited for a case wherein, when integration of patterns such as shown in FIG. 22 is further advanced, separation of patterns with respect to the gate line direction (Y direction in the drawing) becomes close to the limit.

Figure 28:
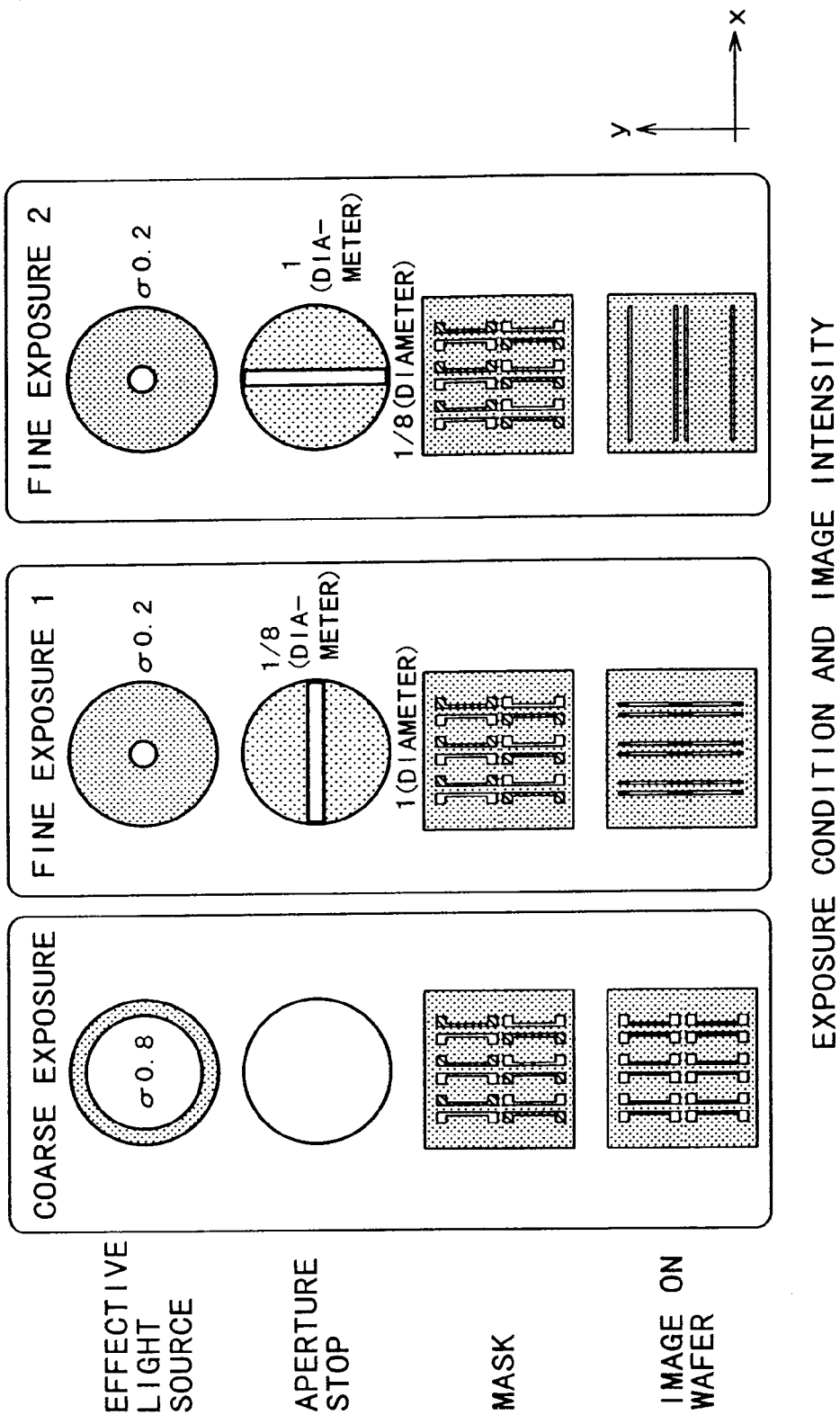
FIG. 28 is a schematic view for explaining an exposure condition and image intensity, in a still further embodiment of the present invention.

In this embodiment, as shown in FIG. 28, triple exposure, of a coarse exposure process and first and second fine exposure processes #1 and #2, is performed. In the fine line exposure, in addition to the first fine line exposure (the same as the fine line exposure of FIG. 6) at the middle of the drawing, the second fine line exposure is performed by using an aperture stop having an opening direction different by 90 degrees from that of the aperture stop 85. This provides an effect of an enhancement of the separation boundary between the basic gate patterns.

As shown in the drawing, the second fine line exposure #2 is similar to the first fine line exposure #1 in that small σ illumination as well as spatial frequency adjustment using an aperture stop are performed. However, by using the mechanism shown in FIG. 10, the orientation of an oblong opening of the aperture stop is rotated by 90 degrees. With this operation, the resolution, in the Y direction in which higher resolution is required as a result of integration, can be improved. By superposed exposures, separation of basic patterns in the gate line direction is facilitated.

The present invention is not limited to the embodiments described above, and the exposure sequence, for example, may be modified within the scope of the invention.

Figure 29:
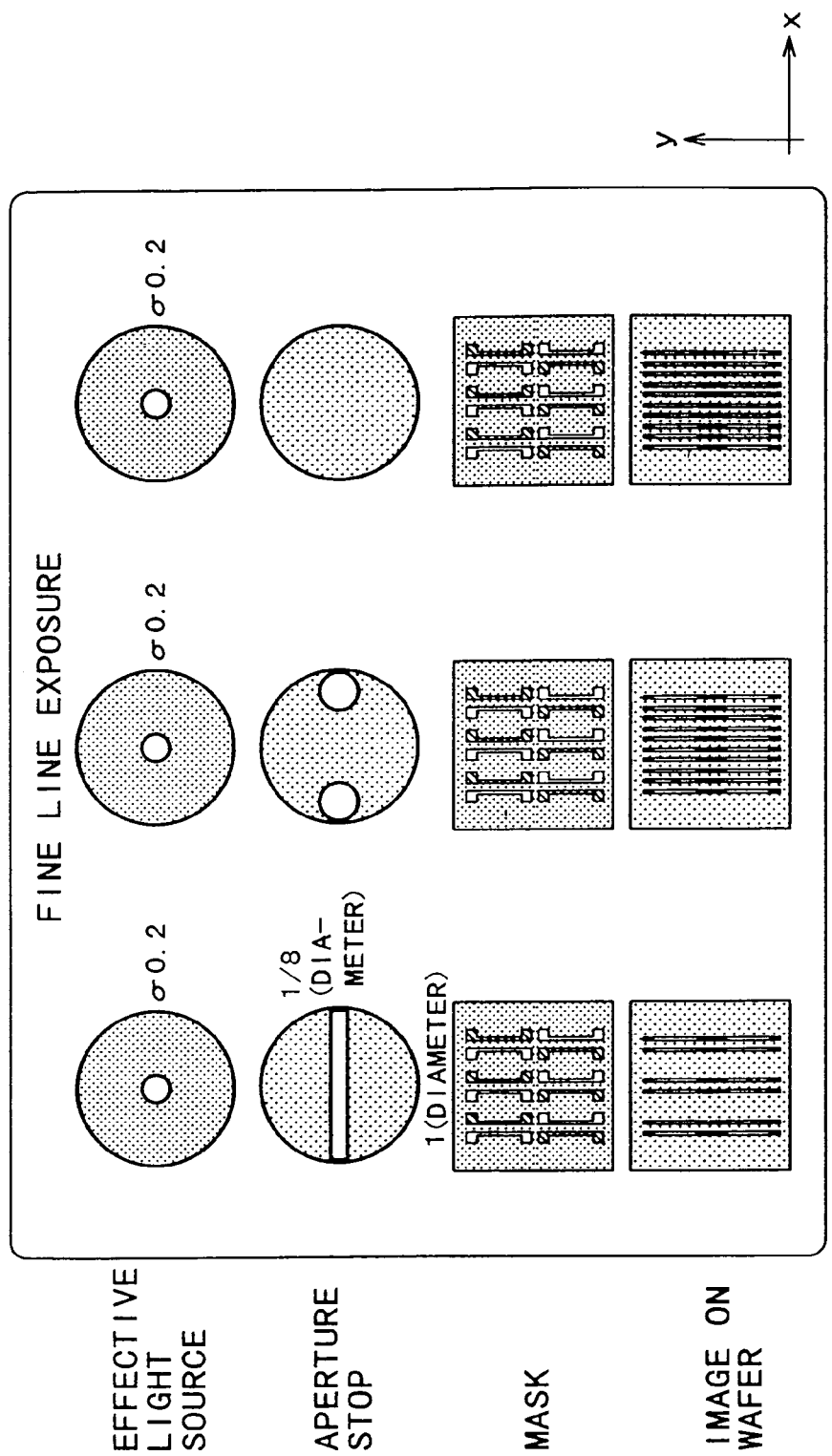
FIG. 29 is a schematic view for explaining a yet further embodiment of the present invention.

Particularly, the shape of the opening of the aperture stop of the illumination optical system 12 or the shape of the opening of the aperture stop of the projection optical system 18 may be determined as desired in accordance with a circuit pattern to be transferred to a wafer. The fine line exposure may use various modifications such as ring illumination, quadruple-pole illumination, an elliptical aperture stop, or a quadruple-opening aperture stop, for example. FIG. 29 illustrates examples of variations of aperture stops for fine line exposure. In the aperture stop at the right hand side, the transmission factor increases gradually from the center of the periphery.

Figure 30:
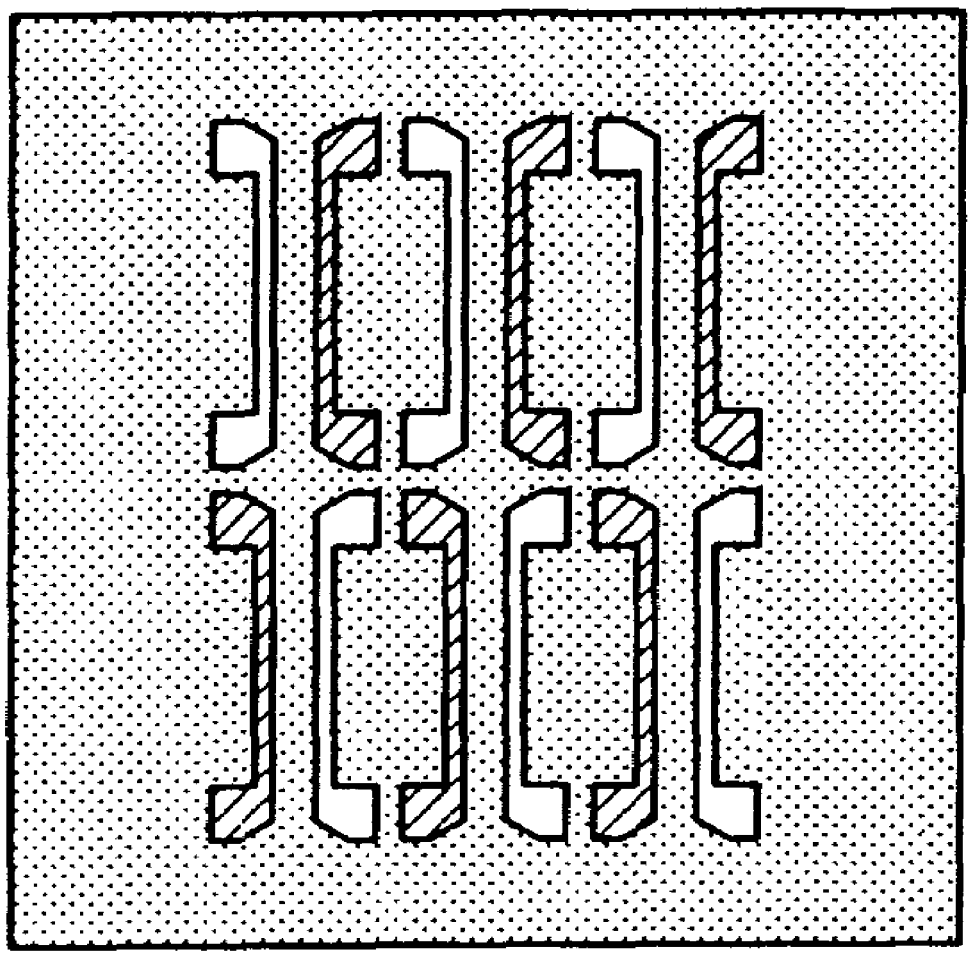
FIG. 30 is a schematic view of another example of a mask according to the present invention.

In order to improve the separation characteristic of basic gate patterns or to correct the linewidth shape, for example, the shape of the gate pattern upon the mask may be modified partially, from a pattern desired. FIG. 30 shows a phase shift type mask to be used with the present invention, for improving separation of gate patterns.

The opening portion depicted by hatching in FIG. 30 functions to apply a phase difference of 180 degrees (π) to transmitted light with respect to the other opening portion.

Figure 33:
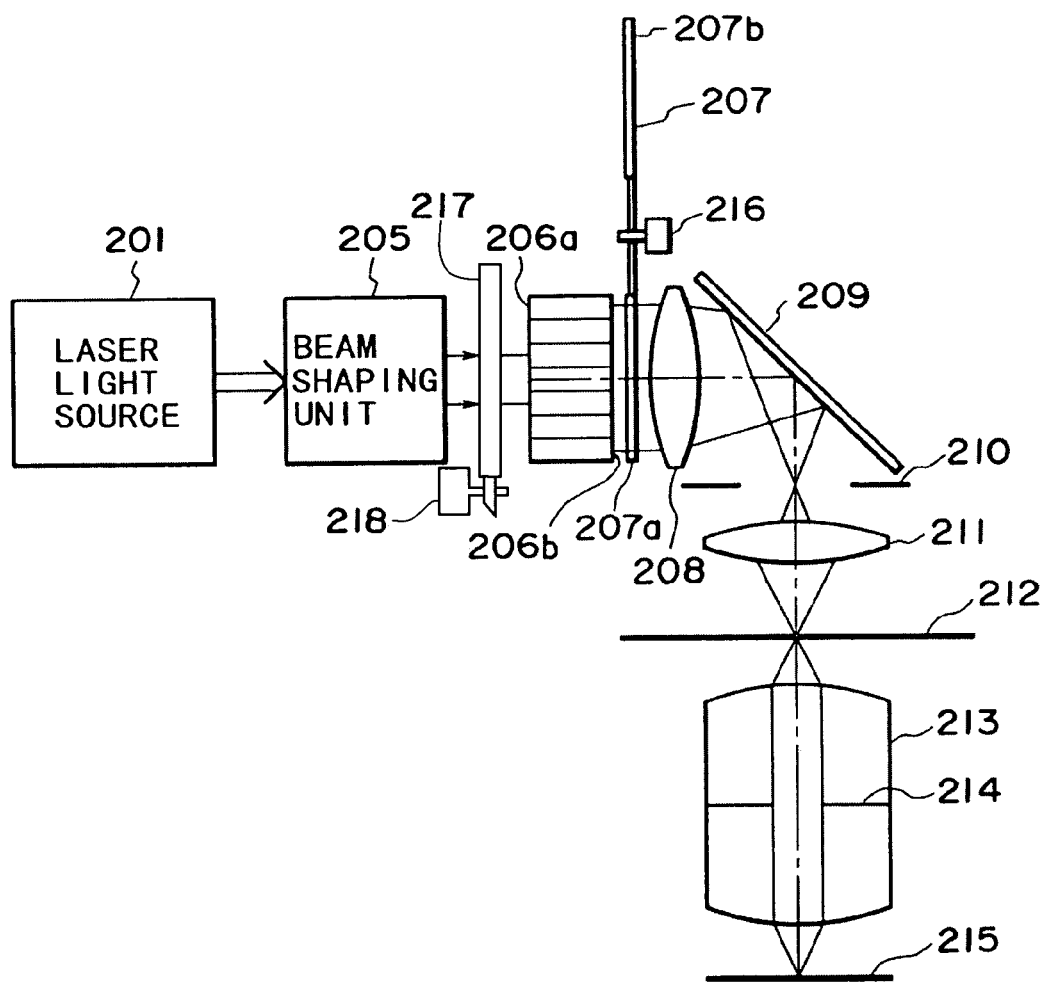
FIG. 33 is a schematic view for explaining an optical system of an exposure apparatus according to a still further embodiment of the present invention.

FIG. 33 is a schematic view for explaining an embodiment of a specific optical arrangement for an exposure apparatus, according to the present invention, which can be used to perform various multiple exposure procedures described above.

Specifically, this embodiment is applied to an exposure apparatus of a step-and-repeat type or a step-and-scan type, for use in a lithographic process of a submicron order or quarter-micron order.

In FIG. 33, laser light from a laser light source 201 enters a beam shaping unit 205 by which the beam diameter thereof is expanded. The light then impinges on a light entrance surface 206*a* of an optical integrator 206. The optical integrator 206 comprises small lenses (fly's eye lenses) $6_i$ (i=1 to N) of a rectangular or circular sectional shape, arrayed two-dimensionally with a predetermined pitch. Secondary light sources are produced adjacent to the light exit surface 206*b* thereof.

Light quantity control means 217 is disposed adjacent to the light entrance surface 206*a* of the optical integrator 206, and it is made movable along a plane (X-Y plane) perpendicular to the optical axis La of the optical system 205 (illumination system), along the optical axis La direction, and along a direction with a predetermined angle with respect to the optical axis La.

The light quantity control means 217 controls the quantity of light passing through at least one small lens, among the small lenses of the optical integrator 206, by using a light quantity adjuster which comprises an ND filter or a light blocking material, for example. Denoted at 218 is a driving mechanism for moving the light quantity control means 217 along the plane perpendicular to the optical axis, along the optical axis direction, or along the direction of a predetermined angle with respect to the optical axis, in response to a signal from illuminance distribution measuring means (not shown) for measuring illuminance upon the surface of a masking blade 210, a reticle (mask) 212 or a wafer 215, by which the illuminance distribution on the surface to be illuminated (i.e., masking blade 210) can be adjusted.

Denoted at 217 is a stop which corresponds to the interchangeable stop 16 of FIG. 1. It serves to determine the shape of the secondary light source. The stop 217 has a structure that various stops 7*a* and 7*b* can be interchangeably and selectively disposed on the light path, by using a stop changing mechanism (actuator) and in accordance with the illumination condition. The stop 207 may include, for example, a stop with an ordinary circular opening, a ring-illumination stop effective to change the light intensity distribution on the pupil plane 214 of the projection lens 213, a quadruple-pole illumination stop, and a small a illumination stop. One of these stops can be selectively inserted into the light path.

In this embodiment, by using various stops 207, the light entering a condenser lens 208 is changed in various ways, by which the light intensity distribution on the pupil plane 214 of the projection optical system 213 is controlled appropriately. The condenser lens is changed in various ways, by which the light intensity distribution on the pupil plane 214 of the projection optical system 213 is controlled appropriately. The condenser lens 208 serves to collect light rays emitted from the secondary light source, adjacent to the light exit surface 206b of the optical integrator 206 and passed through the stop 207. The collected lights rays are then reflected by a mirror 209, and they are superposed one upon another on the masking blade 210 plane to illuminate the same uniformly. The masking blade 210 comprises a plurality of movable light blocking plates for variable determining the aperture shape as desired.

Denoted at 211 is an imaging lens, which serves to transfer the aperture shape of the masking blade 210 onto a reticle (mask) 212 surface, which is the surface to be illuminated, whereby a necessary region on the reticle 212 surface is illuminated uniformly.

Denoted at 213 is a projection optical system (projection lens), for projecting a circuit pattern of the reticle 217 onto the surface of a wafer (substrate) 215 placed on a wafer chuck, in a reduced scale. Denoted at 214 is a pupil plane of this projection optical system 213. On this pupil plane 214, various stops 19 having been described with reference to FIG. 1 can be detachably disposed.

In the optical arrangement of this embodiment, a light emitting portion 201a, a second focal point 204, the light entrance surface 206a of the optical integrator 206, the masking blade 210, the reticle 212 and the wafer 215 are placed substantially in an optically conjugate relationship with each other. Also, the stop 207a and the pupil plane 214 of the projection optical system 213 are placed substantially in an optically conjugate relation.

With the structure of this embodiment described above, a pattern on the reticle 212 surface is projected and transferred to the wafer 214 surface in a reduced scale. Then, after a predetermined development process is performed, devices (semiconductor chips) are produced.

In this embodiment, as described above, stops of different aperture shapes are used selectively in accordance with the shape of a pattern on a reticle 212, to thereby change the light intensity distribution to be produced on the pupil plane 214 of the projection optical system 213 in various ways.

As regards the illumination method using the illumination optical system, the mask pattern may be illuminated light from one of a KrF excimer laser, an ArF excimer laser and an $F_2$ excimer laser.

As regards the exposure apparatus, the mask pattern may be projected by use of a projection optical system comprising one of a dioptric system, a catadioptric system and a catoptric system.

As regards the exposure apparatus, the present invention is applicable to various exposure apparatuses, such that a step-and-repeat type reduction projection exposure apparatus having an exposure mode according to an exposure method of the present invention or a step-and-scan type reduction projection exposure apparatus having an exposure mode according to an exposure method of the present invention, may be accomplished.

Next, an embodiment of a semiconductor device manufacturing method, which uses a projection exposure apparatus having an exposure mode for multiple exposure of the present invention, such as described above, will be explained.

Figure 31:
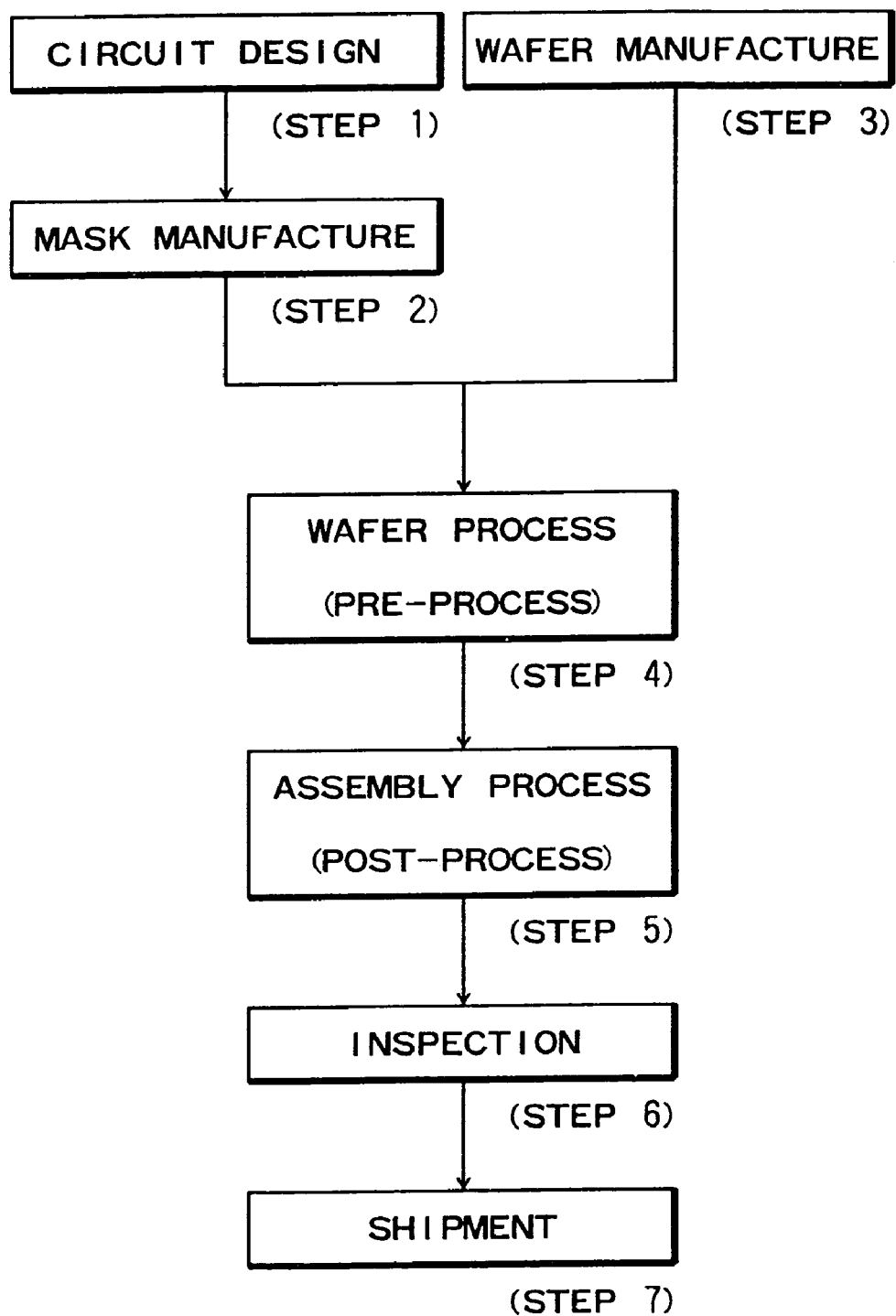
FIG. 31 is a flow chart of device manufacturing processes, in an embodiment of the present invention.

FIG. 31 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the so prepared mask and wafer, circuits are practically formed on the wafer through lithography. Step 5 subsequent to this is an assembling step, which is called a post-process, wherein the wafer having been processed by step 4 is formed into semiconductor chips. This step includes an assembling (dicing and bonding) process and a packaging (chip sealing) process. Step 6 is an inspection step wherein an operation check, a durability check, and so on, for the semiconductor devices provided by step 5, are carried out. With these processes, semiconductor devices are completed and they are shipped (step 7).

Figure 32:
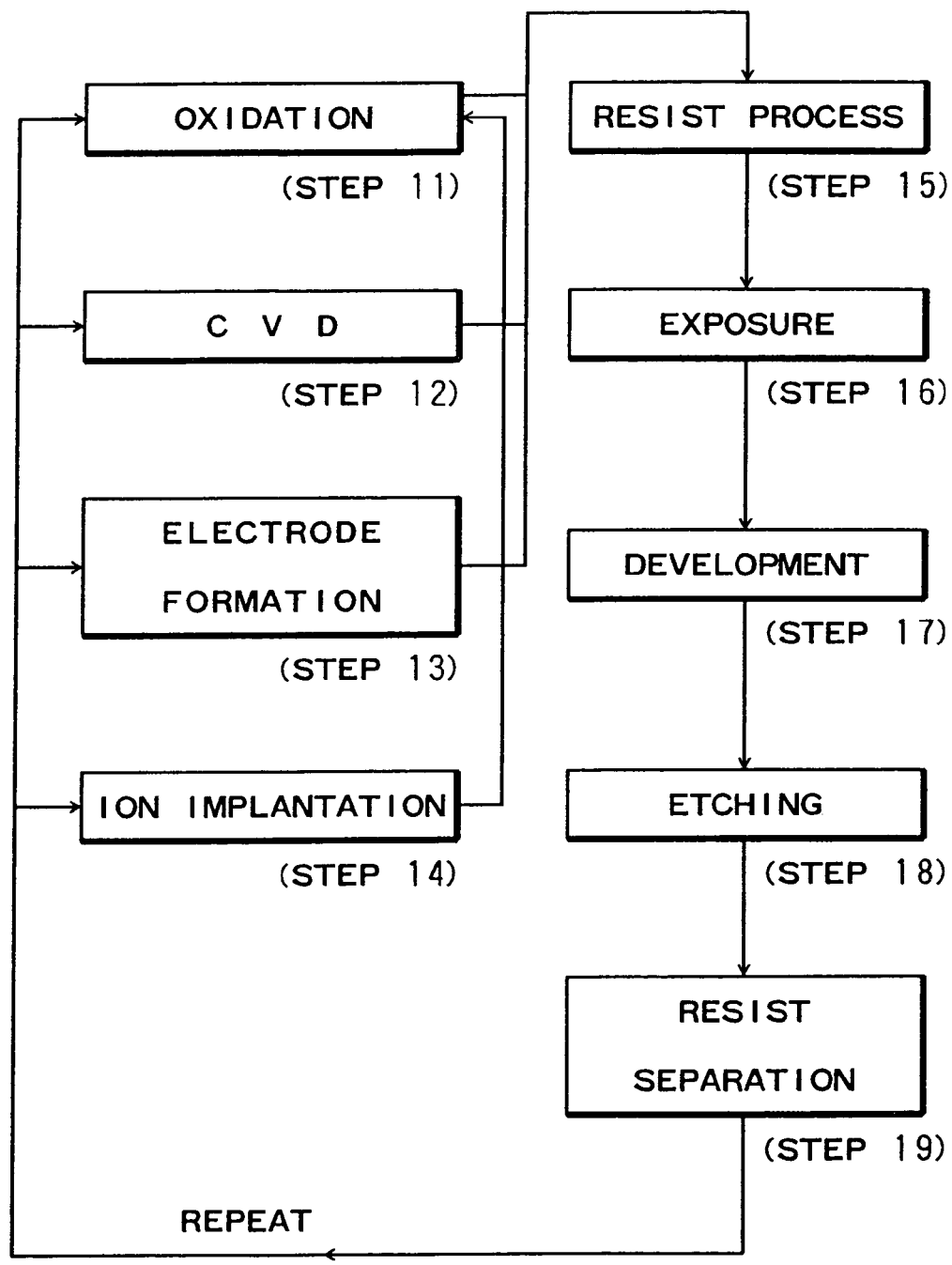
FIG. 32 is a flow chart of a wafer process, in the procedure of FIG. 31.

FIG. 32 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
    first exposure means for illuminating a predetermined mask with light of a predetermined wavelength under a first mask-illumination condition, to print a first pattern on a predetermined exposure region; and
    second exposure means for illuminating the predetermined mask with light of the predetermined wavelength under a second mask-illumination condition, different from the first mask-illumination condition, to superposedly print a second pattern on the predetermined exposure region where the first pattern has been printed, wherein a first exposure by said first exposure means and a second exposure by said second exposure means are carried out simultaneously, prior to a development process.

2. An exposure apparatus according to claim 1, wherein, under the first mask-illumination condition, the predetermined mask is illuminated with a first sigma, and, under the second mask-illumination condition, the predetermined mask is illuminated with a second sigma, different from the first sigma.

3. An apparatus according to claim 2, wherein the illumination of the mask is performed with bright field illumination.

4. An apparatus according to claim 2, wherein the exposure by said first exposure means produces a first region in which an exposure amount does not reach an exposure threshold value, while the exposure by said second exposure means produces a second region in which an exposure amount does not reach the exposure threshold value, and wherein the exposure threshold value is reached in at least a portion of the first and second regions as superposed with each other.

5. An apparatus according to claim 2, wherein the first and second patterns have different shapes.

6. An exposure apparatus according to claim 1, wherein, under the first mask-illumination condition, the predetermined mask is illuminated with a first numerical aperture, and, under the second mask-illumination condition, the predetermined mask is illuminated with a second numerical aperture, different from the first numerical aperture.

7. An apparatus according to claim 6, wherein the illumination of the mask is performed with bright field illumination.

8. An apparatus according to claim 6, wherein the exposure by said first exposure means produces a first region in which an exposure amount does not reach an exposure threshold value, while the exposure by said second exposure means produces a second region in which an exposure amount does not reach the exposure threshold value, and wherein the exposure threshold value is reached in at least a portion of the first and second regions as superposed with each other.

9. An apparatus according to claim 6, wherein the first and second patterns have different shapes.

10. An exposure apparatus according to claim 1, wherein, under the first mask-illumination condition, the predetermined mask is illuminated with light being obliquely incident thereon, and, under the second mask-illumination condition, the predetermined mask is illuminated with light being perpendicularly incident thereon.

11. An apparatus according to claim 10, wherein the illumination of the mask is performed with bright field illumination.

12. An apparatus according to claim 10, wherein the exposure by said first exposure means produces a first region in which an exposure amount does not reach an exposure threshold value, while the exposure by said second exposure means produces a second region in which an exposure amount does not reach the exposure threshold value, and wherein the exposure threshold value is reached in at least a portion of the first and second regions as superposed with each other.

13. An apparatus according to claim 10, wherein the first and second patterns have different shapes.

14. An apparatus according to claim 1, wherein the mask includes an opening pattern with a linewidth not greater than a resolution limit of an exposure apparatus to be used.

15. An apparatus according to claim 14, wherein there are plural opening patterns juxtaposed with each other.

16. An apparatus according to claim 14, wherein the mask includes a phase shift pattern.

17. An apparatus according to claim 14, wherein there is a desired pattern and an auxiliary pattern having a shape different from that of a repetition of the desired pattern, disposed adjacent to the mask.

18. An apparatus according to claim 1, wherein the mask is illuminated with light from one of a KrF excimer laser, an ArF excimer laser and an $F_2$ excimer laser.

19. An apparatus according to claim 1, wherein the mask is projected by use of a projection optical system comprising one of a dioptric system, a catadioptric system and a catoptric system.

20. An apparatus according to claim 1, wherein the exposure wavelength of said first exposure means and the exposure wavelength of said second exposure means are substantially the same.

21. A device manufacturing method, comprising the steps of:
exposing a wafer to a pattern on a mask by use of an exposure apparatus as recited claim 1; and
developing the exposed wafer.

22. An apparatus according to claim 1, wherein the illumination of the mask is performed with bright field illumination.

23. An apparatus according to claim 1, wherein the exposure by said first exposure means produces a first region in which an exposure amount does not reach an exposure threshold value, while the exposure by said second exposure means produces a second region in which an exposure amount does not reach the exposure threshold value, and wherein the exposure threshold value is reached in at least a portion of the first and second regions as superposed with each other.

24. An apparatus according to claim 1, wherein the first and second patterns have different shapes.

25. An apparatus according to claim 1, wherein said exposure apparatus is a step-and-scan type exposure apparatus.

26. An exposure apparatus comprising:
an illumination optical system for illuminating a predetermined mask;
a projection optical system for projecting light from the mask to a predetermined exposure region;
first exposure means for illuminating the mask under a first illumination condition and for projecting light from the mask to the exposure region at a first spatial frequency passage spectrum of the projection system, so that the exposure region is exposed with a first pattern; and
second exposure means for illuminating the mask under a second illumination condition, different from the first illumination condition, and for projecting light from the mask to the exposure region at a second spatial frequency passage spectrum of the projection system, different from the first spatial frequency passage spectrum, so that the exposure region is exposed with a second pattern,
wherein a first exposure by said first exposure means and a second exposure by said second exposure means are carried out simultaneously, prior to a development process.

27. An apparatus according to claim 26, wherein the mask includes an opening pattern with a linewidth not greater than a resolution limit of an exposure apparatus to be used.

28. An apparatus according to claim 27, wherein there are plural opening patterns juxtaposed with each other.

29. An apparatus according to claim 27, wherein the mask includes a phase shift pattern.

30. An apparatus according to claim 26, wherein one of a shape of an aperture opening of the projection optical system and a transmission factor distribution is changed to change the spatial frequency passage spectrum of the projection optical system.

31. A device manufacturing method, comprising the steps of:
exposing a wafer to a pattern on a mask by use of an exposure apparatus as recited in claim 26; and
developing the exposed wafer.

32. An apparatus according to claim 26, wherein said exposure apparatus is a step-and-scan type exposure apparatus.

33. An exposure apparatus comprising:
an illumination optical system for illuminating a predetermined mask;
a projection optical system for projecting light from the mask to a predetermined exposure region;
first exposure means for illuminating the mask with a first sigma and for projecting light from the mask to the exposure region at a first spatial frequency passage spectrum of the projection system, so that the exposure region is exposed with a first pattern; and
second exposure means for illuminating the mask with a second sigma, different from the first sigma, and for projecting light from the mask to the exposure region at a second spatial frequency passage spectrum of the projection system, different from the first spatial frequency passage spectrum, so that the exposure region is exposed with a second pattern,
wherein a first exposure by said first exposure means and a second exposure by said second exposure means are carried out prior to a development process, and
wherein a first exposure by said first exposure means and a second exposure by said second exposure means are carried out simultaneously.

34. An apparatus according to claim 33, wherein said exposure apparatus is a step-and-scan type exposure apparatus.

35. A device manufacturing method, comprising the steps of:
exposing a wafer to a pattern on a mask by use of an exposure apparatus as recited in claim 33; and
developing the exposed wafer.

36. An exposure apparatus comprising:
an illumination optical system for illuminating a predetermined mask;
a projection optical system for projecting light from the mask to a predetermined exposure region;
first exposure means for illuminating the mask with a first numerical aperture and for projecting light from the mask to the exposure region at a first spatial frequency passage spectrum of the projection system, so that the exposure region is exposed with a first pattern; and
second exposure means for illuminating the mask with a second numerical aperture, different from the first numerical aperture, and for projecting light from the mask to the exposure region at a second spatial frequency passage spectrum of the projection system, different from the first spatial frequency passage spectrum, so that the exposure region is exposed with a second pattern,
wherein a first exposure by said first exposure means and a second exposure by said second exposure means are carried out prior to a development process, and
wherein a first exposure by said first exposure means and a second exposure by said second exposure means are carried out simultaneously.

37. An apparatus according to claim 36, wherein said exposure apparatus is a step-and-scan type exposure apparatus.

38. A device manufacturing method, comprising the steps of:
exposing a wafer to a pattern on a mask by use of an exposure apparatus as recited in claim 36; and
developing the exposed wafer.

39. An exposure apparatus comprising:
an illumination optical system for illuminating a predetermined mask;
a projection optical system for projecting light from the mask to a predetermined exposure region;
first exposure means for obliquely illuminating the mask and for projecting light from the mask to the exposure region at a first spatial frequency passage spectrum of the projection system, so that the exposure region is exposed with a first pattern; and
second exposure means for perpendicularly illuminating the mask and for projecting light from the mask to the exposure region at a second spatial frequency passage spectrum of the projection system, different from the first spatial frequency passage spectrum, so that the exposure region is exposed with a second pattern,
wherein a first exposure by said first exposure means and a second exposure by said second exposure means are carried out prior to a development process, and
wherein a first exposure by said first exposure means and a second exposure by said second exposure means are carried out simultaneously.

40. An apparatus according to claim 39, wherein said exposure apparatus is a step-and-scan type exposure apparatus.

41. A device manufacturing method, comprising the steps of:
exposing a wafer to a pattern on a mask by use of an exposure apparatus as recited in claim 39; and
developing the exposed wafer.

42. An exposure apparatus comprising:
an illumination optical system for illuminating a predetermined mask;
a projection optical system for projecting light from the mask to a predetermined exposure region;
first exposure means for illuminating the mask under a first illumination condition and for projecting light from the mask to the exposure region at a first spatial frequency passage spectrum of the projection system, so that the exposure region is exposed with a first pattern; and
second exposure means for illuminating the mask under a second illumination condition, different from the first illumination condition, and for projecting light from the mask to the exposure region at a second spatial frequency passage spectrum of the projection system, different from the first spatial frequency passage spectrum, so that the exposure region is exposed with a second pattern,
wherein the mask has a repetition pattern comprising repeatedly disposed basic patterns, being defined by light transmissive portions, wherein light passed through adjacent basic patterns of the repetition pattern have a mutual optical phase difference of about 180 degrees, and wherein a first exposure by said first exposure means and a second exposure by said second exposure means are carried out simultaneously, prior to a development process.

43. A device manufacturing method, comprising the steps of:

exposing a wafer to a pattern on a mask by use of an exposure apparatus as recited in claim 42; and developing the exposed wafer.

44. An apparatus according to claim 42, wherein said exposure apparatus is a step-and-scan type exposure apparatus.

45. An exposure apparatus, comprising:

first exposure means for illuminating a predetermined mask with light of a predetermined wavelength under a first mask-illumination condition, to print a first pattern on a predetermined exposure region; and second exposure means for illuminating the predetermined mask with light of the predetermined wavelength under a second mask-illumination condition, to print a second pattern on the predetermined exposure region, wherein a first exposure by said first exposure means and a second exposure by said second exposure means are carried out simultaneously, prior to a development process, and wherein the state of polarization of the light used by said first exposure means for illumination of the predetermined mask is different from the state of polarization of the light used by said second exposure means for illumination of the predetermined mask.

46. An exposure apparatus according to claim 45, wherein, under the first mask-illumination condition, the predetermined mask is illuminated with a first sigma, and, under the second mask-illumination condition, the predetermined mask is illuminated with a second sigma, different from the first sigma.

47. An exposure apparatus according to claim 45, wherein, under the first mask-illumination condition, the predetermined mask is illuminated with a first numerical aperture, and, under the second mask-illumination condition, the predetermined mask is illuminated with a second numerical aperture, different from the first numerical aperture.

48. An exposure apparatus according to claim 45, wherein, under the first mask-illumination condition, the predetermined mask is illuminated with light being obliquely incident thereon, and, under the second mask-illumination condition, the predetermined mask is illuminated with light being perpendicularly incident thereon.

49. An apparatus according to claim 45, wherein the mask includes an opening pattern with a linewidth not greater than a resolution limit of an exposure apparatus to be used.

50. An apparatus according to claim 49, wherein there are plural opening patterns juxtaposed with each other.

51. An apparatus according to claim 49, wherein the mask includes a phase shift pattern.

52. An apparatus according to claim 49, wherein there is a desired pattern and an auxiliary pattern having a shape different from that of a repetition of the desired pattern, disposed adjacent to the mask.

53. An apparatus according to claim 45, wherein the mask is illuminated with light from one of a KrF excimer laser, an ArF excimer laser and an $F_2$ excimer laser.

54. An apparatus according to claim 45, wherein the mask is projected by use of a projection optical system comprising one of a dioptric system, a catadioptric system and a catoptric system.

55. An apparatus according to claim 45, wherein the exposure wavelength of said first exposure means and the exposure wavelength of said second exposure means are substantially the same.

56. An apparatus according to claim 45, wherein exposures of the exposure region under different illumination conditions are performed simultaneously without interference of lights in the different illumination conditions.

57. An apparatus according to claim 45, wherein the illumination of the mask is performed with bright field illumination.

58. An apparatus according to claim 45, wherein the exposure by said first exposure means produces a first region in which an exposure amount does not reach an exposure threshold value, while the exposure by said second exposure means produces a second region in which an exposure amount does not reach the exposure threshold value, and wherein the exposure threshold value is reached in at least a portion of the first and second regions as superposed with each other.

59. An apparatus according to claim 45, wherein the first and second patterns have different shapes.

60. A device manufacturing method, comprising the steps of:

exposing a wafer to a pattern on a mask by use of an exposure apparatus as recited in claim 45; and developing the exposed wafer.

61. An apparatus according to claim 45, wherein said exposure apparatus is a step-and-scan type exposure apparatus.

* * * * *

UNITED STATES PATENT AND TRADEMARK OFFICE
CERTIFICATE OF CORRECTION

PATENT NO. : 7,023,522 B2  
APPLICATION NO. : 11/003889  
DATED : April 4, 2006  
INVENTOR(S) : Mitsuro Sugita et al.

Page 1 of 1

It is certified that error appears in the above-identified patent and that said Letters Patent is hereby corrected as shown below:

IN THE DRAWINGS:
   On "Sheet 4 of 26," in "FIG. 5," in the line directly above "FIG. 5," "EXPOSUR" should read -- EXPOSURE --.
   On "Sheet 17 of 26," in "FIG. 23," in the last line of the description of the upper most box, "LINEWITH)" should read -- LINEWIDTH) --.
   On "Sheet 19 of 26," in "FIG. 26," in the legend under the left-most box, "EXPSURE" should read -- EXPOSURE --.

COLUMN 7:
   Line 7, "193 runm)" should read -- 193 nm) --.

COLUMN 20:
   Line 43, "mas" should read -- mask --.

COLUMN 21:
   Line 57, "small a" should read -- small σ --.

COLUMN 25:
   Line 7, "small a" should read -- small σ --.

COLUMN 28:
   Line 23, "recited" should read -- recited in --.

Signed and Sealed this

Tenth Day of October, 2006

JON W. DUDAS  
*Director of the United States Patent and Trademark Office*